(12) United States Patent
Colton et al.

(10) Patent No.: US 12,323,270 B2
(45) Date of Patent: Jun. 3, 2025

(54) CABLING TOPOLOGY FOR EXPANSION

(71) Applicant: Ciena Corporation, Hanover, MD (US)

(72) Inventors: Fabien Colton, Kars (CA); Daniel Rivaud, Ottawa (CA)

(73) Assignee: Ciena Corporation, Hanover, MD (US)

( * ) Notice: Subject to any disclaimer, the term of this patent is extended or adjusted under 35 U.S.C. 154(b) by 357 days.

(21) Appl. No.: 17/670,612

(22) Filed: Feb. 14, 2022

(65) Prior Publication Data

US 2023/0261899 A1     Aug. 17, 2023

(51) Int. Cl.
| | |
|---|---|
| *H05K 7/14* | (2006.01) |
| *H04L 12/46* | (2006.01) |
| *H04L 41/12* | (2022.01) |
| *H04L 43/0811* | (2022.01) |

(52) U.S. Cl.
CPC .............. *H04L 12/46* (2013.01); *H04L 41/12* (2013.01); *H04L 43/0811* (2013.01); *H05K 7/1491* (2013.01)

(58) Field of Classification Search
CPC ..... H04L 12/46; H04L 41/12; H04L 43/0811; H05K 7/1491
See application file for complete search history.

(56) References Cited

U.S. PATENT DOCUMENTS

| | | | |
|---|---|---|---|
| 6,796,437 B2 * | 9/2004 | Krampotich | H04Q 1/062 |
| | | | 361/826 |
| 7,570,860 B2 * | 8/2009 | Smrha | G02B 6/4452 |
| | | | 385/134 |
| 7,973,242 B2 * | 7/2011 | Jones | H04Q 1/062 |
| | | | 174/101 |
| 8,184,526 B2 | 5/2012 | Duncan et al. | |
| 8,630,315 B2 | 1/2014 | Rivaud et al. | |
| 8,776,161 B2 | 7/2014 | Gazier et al. | |
| 9,836,931 B1 | 12/2017 | Rivaud et al. | |
| 9,847,752 B2 | 12/2017 | Rivaud et al. | |
| 10,012,811 B2 | 7/2018 | Rivaud et al. | |
| 10,247,895 B2 | 4/2019 | Rivaud et al. | |
| 10,736,227 B1 | 8/2020 | Rivaud et al. | |
| 10,764,189 B1 | 9/2020 | Rivaud et al. | |
| 10,855,623 B2 | 12/2020 | Estabrooks et al. | |
| 11,018,484 B2 * | 5/2021 | Yokoi | H02G 3/30 |
| 11,102,897 B2 * | 8/2021 | Ford | H05K 5/0226 |

(Continued)

FOREIGN PATENT DOCUMENTS

CA     2 767 373 C     1/2016

*Primary Examiner* — Imani N Hayman
*Assistant Examiner* — Hung Q Dang
(74) *Attorney, Agent, or Firm* — Clements Bernard Walker; Christopher L. Bernard

(57) ABSTRACT

Systems and methods include cabling topology for expansion of network components such as servers, computing devices, routers, switches, and other components of the like. In various embodiments, the present disclosure provides a rack which may be coupled to a plurality of additional side racks. The racks include one or more shelves (systems), the shelves being connected via a plurality of cables each having the same length and any excess slack in the cables is managed via utilizing any of a plurality of hooks. The racks may include a plurality of systems stacked on top of each other which may be connected via the plurality of cables each having the same length and any excess slack in the cables again being managed via any of the plurality of hooks.

17 Claims, 21 Drawing Sheets

(56) References Cited

U.S. PATENT DOCUMENTS

| | | | |
|---|---|---|---|
| 2011/0262097 A1* | 10/2011 | Hruby | H04Q 1/062 361/827 |
| 2017/0214516 A1 | 7/2017 | Rivaud et al. | |
| 2017/0288678 A1 | 10/2017 | Estabrooks et al. | |
| 2017/0336903 A1 | 11/2017 | Rivaud et al. | |
| 2018/0077080 A1 | 3/2018 | Gazier et al. | |
| 2019/0327126 A1 | 10/2019 | Rivaud et al. | |
| 2019/0327188 A1 | 10/2019 | Rivaud et al. | |
| 2019/0327542 A1 | 10/2019 | Rivaud et al. | |
| 2020/0341218 A1 | 10/2020 | Leclair et al. | |
| 2021/0210894 A1 | 7/2021 | Rivaud et al. | |
| 2021/0239927 A1 | 8/2021 | Rivaud et al. | |
| 2021/0243915 A1 | 8/2021 | Saturley et al. | |
| 2021/0367674 A1 | 11/2021 | Leclair et al. | |

* cited by examiner

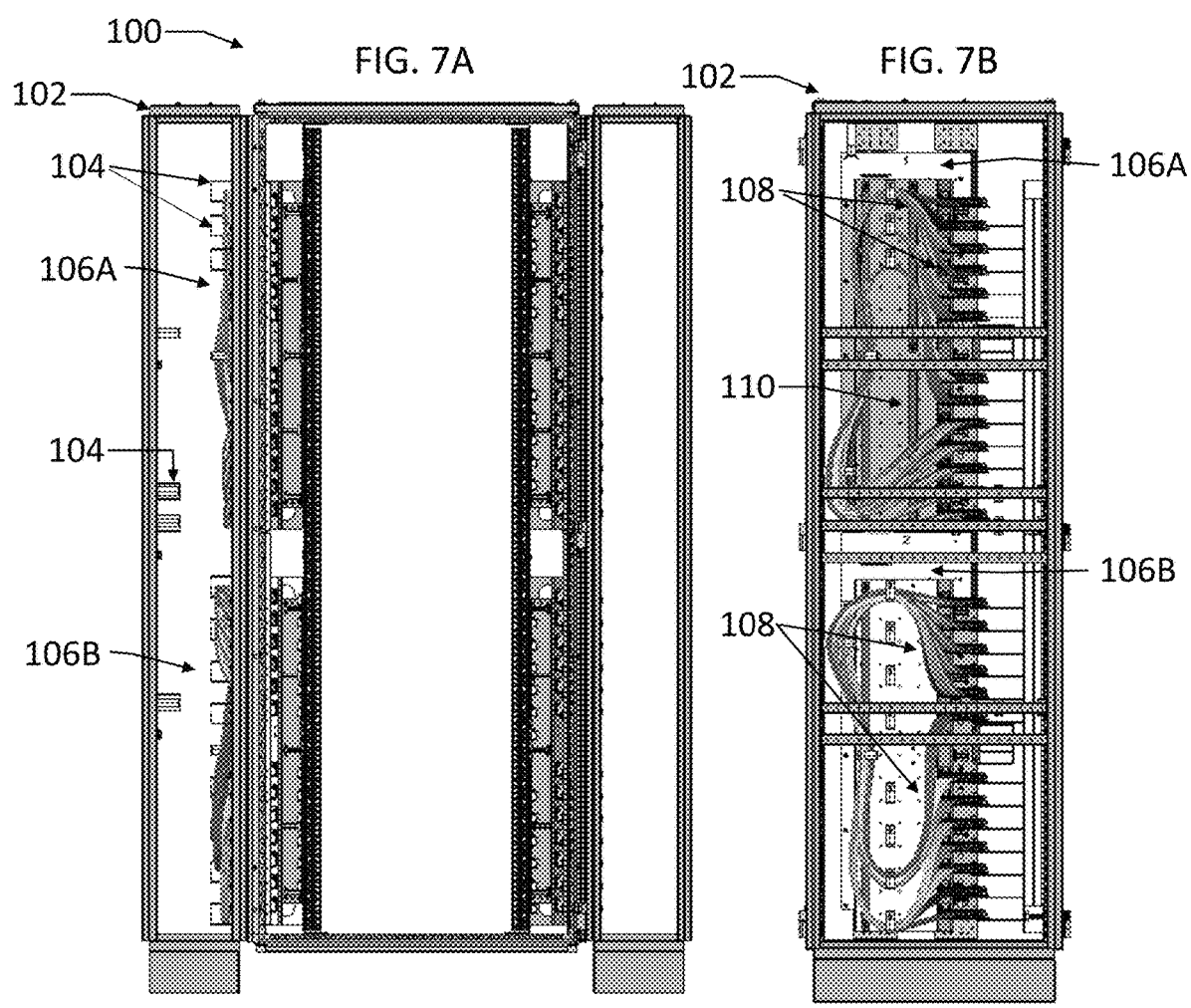

FIG. 10G
FIG. 10H
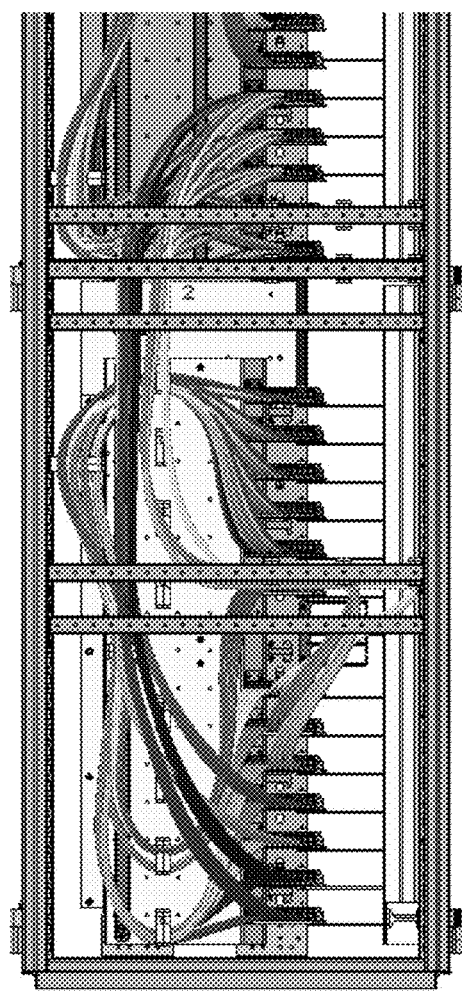
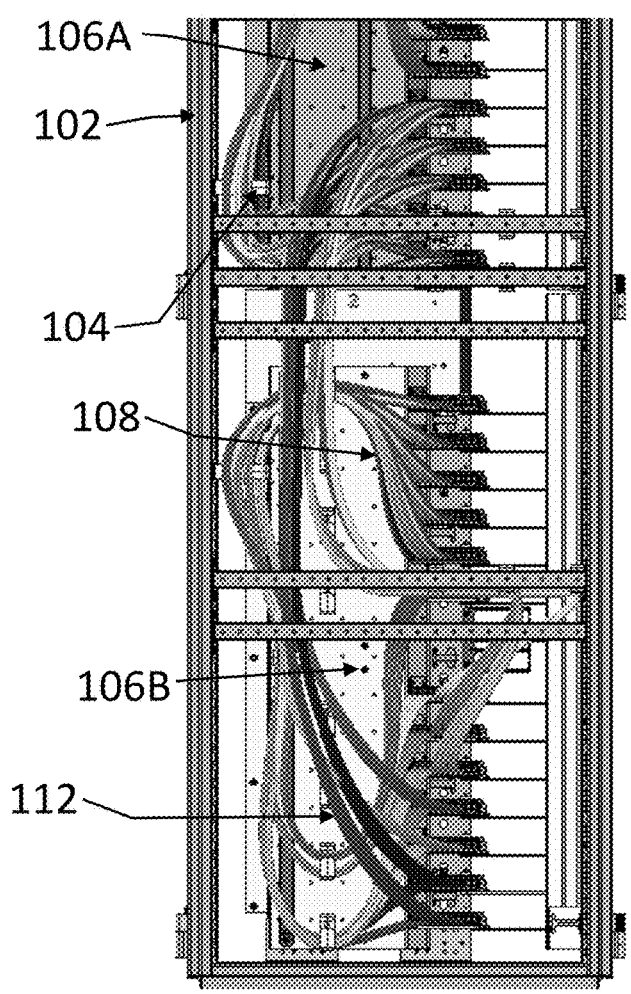

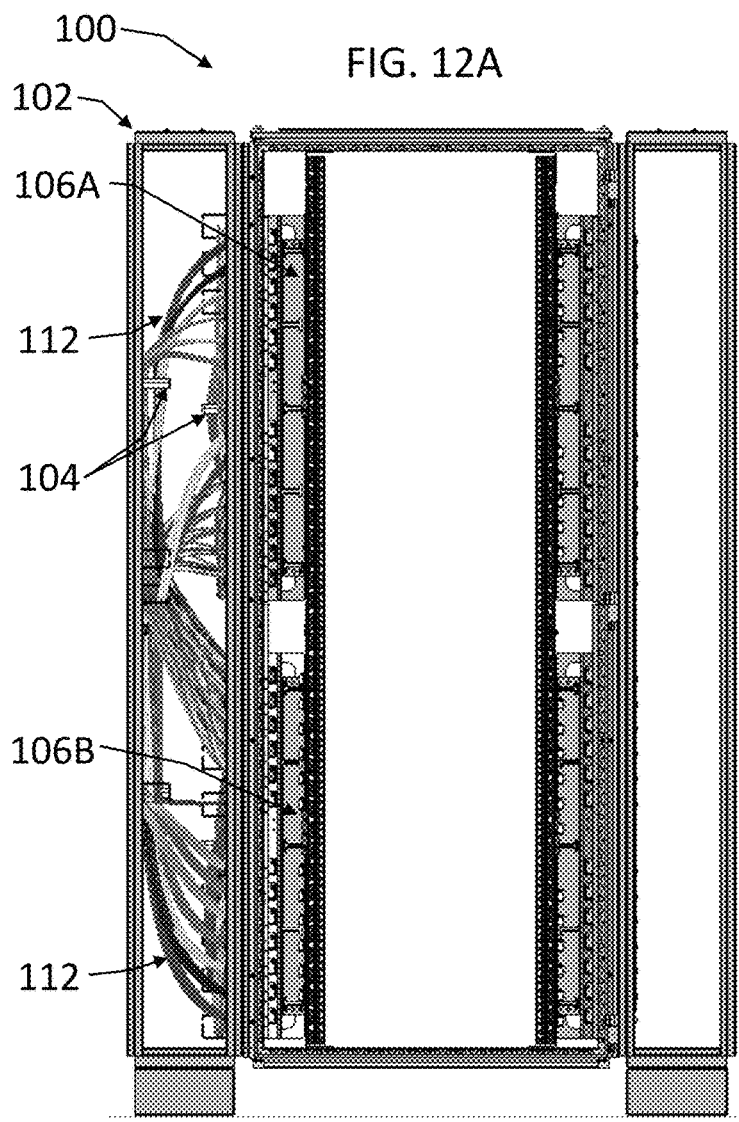
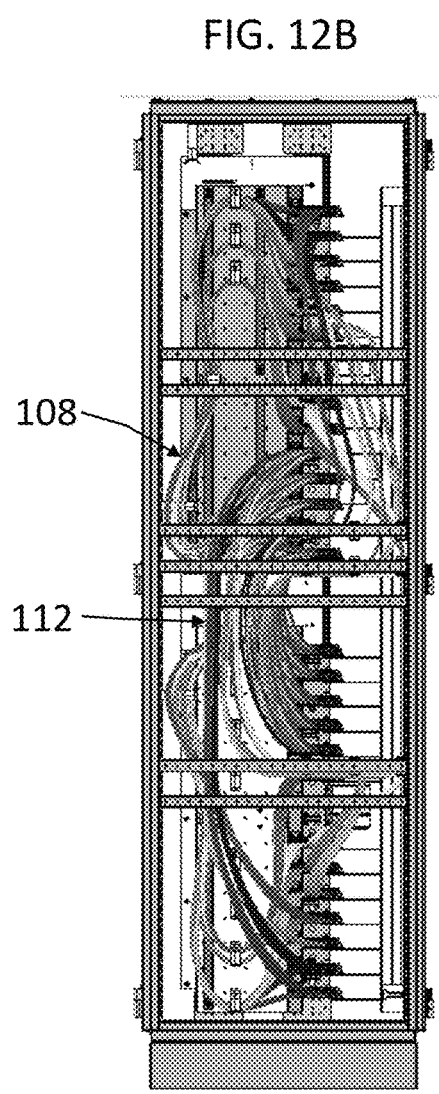
FIG. 12A
FIG. 12B

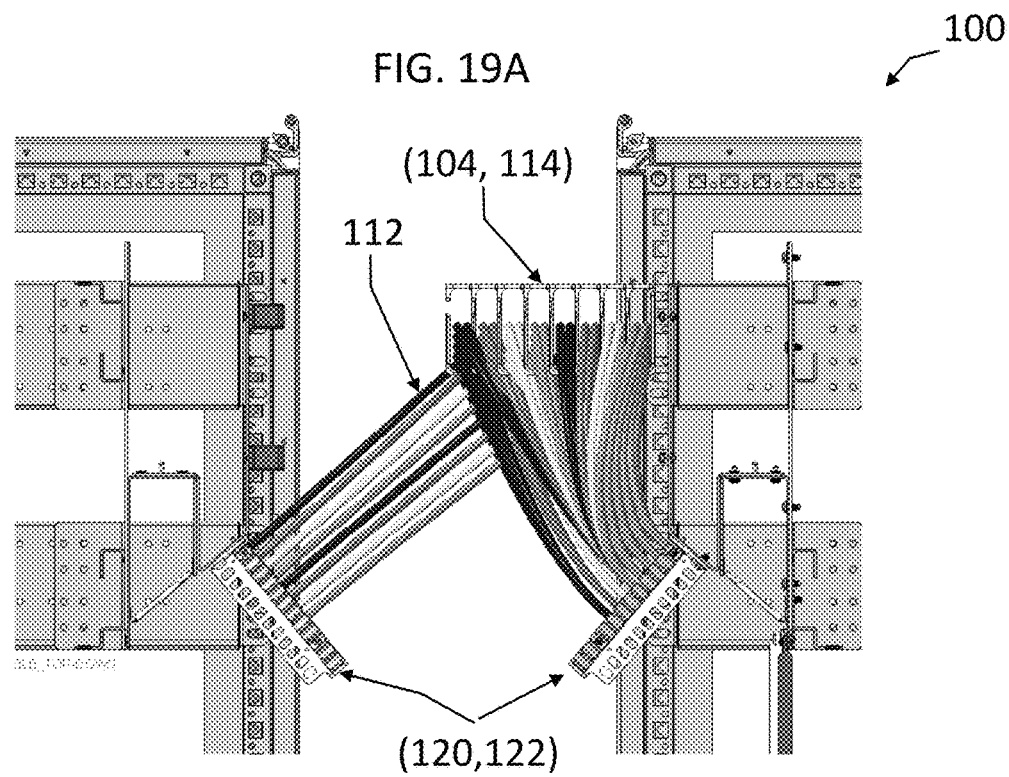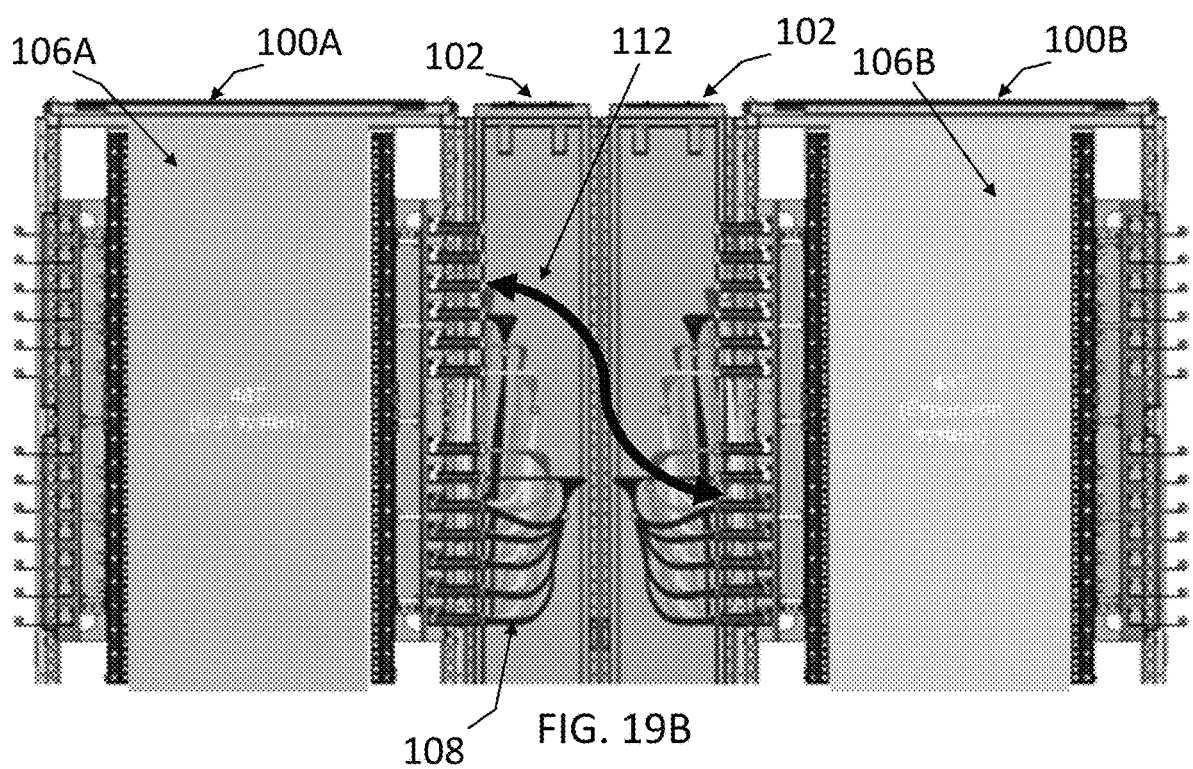

CABLING TOPOLOGY FOR EXPANSION

FIELD OF THE DISCLOSURE

The present disclosure generally relates to computing hardware. More particularly, the present disclosure relates to systems and methods for cabling topology for expansion.

BACKGROUND OF THE DISCLOSURE

Typically, network components such as servers, computing devices, routers, switches, and other components of the like are housed in a rack to organize and secure the various hardware devices. When expansion is necessary, such as the need to add new or replace existing components, the existing components may need to be connected to the new components via cables, resulting in a cabling challenge. New devices may be stored in the same rack as the existing components, or a new rack may be necessary to house the new devices, the new rack typically placed next to the existing rack. Present solutions require the use of multiple cable lengths to connect such devices because there is no scheme to absorb slack such as the cabling topology described herein. Existing solutions also do not allow for in-service expansion, resulting in network down-time if expansion or maintenance is necessary.

BRIEF SUMMARY OF THE DISCLOSURE

In various embodiments, the present disclosure relates to systems and methods for cabling topology for expansion of network components such as servers, computing devices, routers, switches, and other components of the like. In various embodiments, the present disclosure provides a rack which may be coupled to a plurality of additional side racks. The racks include one or more shelves, the shelves being connected via a plurality of cables each having the same length and any excess slack in the cables is managed via utilizing any of a plurality of hooks. The racks may include a plurality of systems stacked on top of each other which may be connected via the plurality of cables each having the same length and any excess slack in the cables again being managed via any of the plurality of hooks.

In an embodiment, a network element includes: a first rack having or connected to one or more cable housings; a plurality of hooks for cable management; and one or more systems disposed in the first rack; wherein the one or more systems are connected via a plurality of cables each having a same length and any excess slack is managed via utilizing any of the plurality of hooks. The network element may further include: a second rack having or connected to one or more cable housings and a plurality of hooks for cable management, wherein the second rack is located adjacent to the first rack, wherein one or more systems in the second rack are connected to one another and to the one or more systems in the first rack, via a plurality of cables each having a same length and any excess slack is managed via utilizing any of the plurality of hooks. The plurality of hooks are located on both an inner side and an outer side of the one or more cable housings. The inner side of the plurality of cable housings is used for local cables and the outer side is used for expansion cables. The plurality of cables include any of Twinaxial cables and fiber cables. The plurality of cables are grouped and color coded for each group. The plurality of hooks include combs to sort and route the plurality of cables. The plurality of hooks are positioned inside of the cable housing and secured to the structure of the cable housing. The plurality of hooks may be arranged in a staircase pattern and are adapted to accept cables in a top-down installation style. The plurality of hooks may be arranged in a staircase pattern and are adapted to accept cables in a bottom-up installation style.

In another embodiment, a method for installing cables in a network element includes the steps of: coupling a first cable to a first slot of a first system; routing the first cable through a first angled comb; guiding the first cable through a plurality of hooks; routing the first cable through a destination angled comb and coupling the cable to a destination slot; and repeating the steps for a plurality of additional cables. The network element includes: a first rack having or connected to one or more cable housings; a plurality of hooks for cable management; and one or more systems disposed in the first rack; wherein the one or more systems are connected via a plurality of cables each having a same length and any excess slack is managed via utilizing any of the plurality of hooks. The network element may further include: a second rack having or connected to one or more cable housings and a plurality of hooks for cable management, wherein the second rack is located adjacent to the first rack, wherein one or more systems in the second rack are connected to one another and to the one or more systems in the first rack, via a plurality of cables each having a same length and any excess slack is managed via utilizing any of the plurality of hooks. The plurality of hooks are located on both an inner side and an outer side of the one or more cable housings. The inner side of the plurality of cable housings is used for local cables and the outer side is used for expansion cables. The plurality of cables include any of Twinaxial cables and fiber cables. The plurality of hooks include combs to sort and route the plurality of cables. The plurality of hooks are positioned inside of the cable housing and secured to the structure of the cable housing. The plurality of hooks may be arranged in a staircase pattern and are adapted to accept cables in a top-down installation style. The plurality of hooks may be arranged in a staircase pattern and are adapted to accept cables in a bottom-up installation style.

BRIEF DESCRIPTION OF THE DRAWINGS

The present disclosure is illustrated and described herein with reference to the various drawings, in which like reference numbers are used to denote like system components/method steps, as appropriate, and in which:

FIG. 7A-7B are diagrams showing a first and second system with non-expansion cables disposed within a rack.

FIG. 10A-10H are diagrams showing the connection of expanded cables on a first and second system disposed within a rack.

FIG. 12A-12B are diagrams showing a first and second system with all expanded cables disposed within a rack.

FIG. 19A-19B are diagrams showing a system expansion wherein two racks are disposed adjacent to one another.

DETAILED DESCRIPTION OF THE DISCLOSURE

Figure 1:
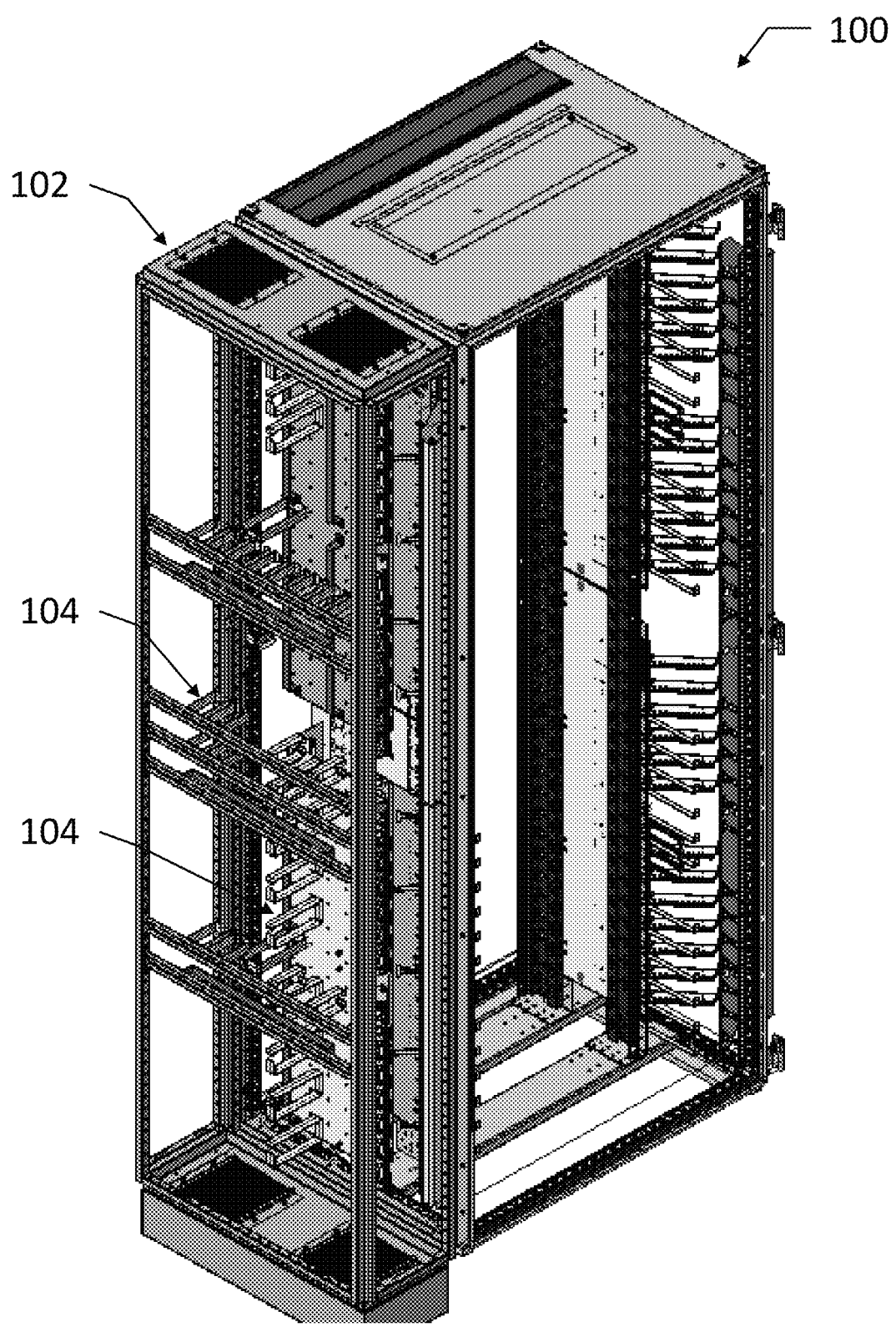
FIG. 1 is a perspective view of a rack including the cable management topology of the present disclosure.

In various embodiments, the present disclosure relates to systems and methods for cabling topology for expansion of network components such as servers, computing devices, routers, switches, and other components of the like. In various embodiments, the present disclosure provides a rack which may be coupled to a plurality of additional side racks. The racks include one or more shelves (systems), the shelves being connected via a plurality of cables each having the same length and any excess slack in the cables is managed via utilizing any of a plurality of hooks. The racks may include a plurality of systems stacked on top of each other which may be connected via the plurality of cables each having the same length and any excess slack in the cables again being managed via any of the plurality of hooks. A single or plurality of racks may be referred to as a network element.

The present disclosure provides a solution to cabling problems within network equipment racks (network elements). It will be appreciated that the racks of the present disclosure include any enclosure containing or storing active or non-active computing components, networking components, storage devices, and/or any other device or component of the like. Such devices (systems) may include servers, computing devices, routers, switches, and others of the like which connect to one another via cabling. The present invention utilized a single cable length for all connections made on the local bundles and remote bundles. The present invention allows the cables to be accessed easily such as in a rack allowing only front and rear access, while also allowing a single cable to be removed and replaced without disrupting other components or cables. In various embodiments, the system includes local bundles that connect within the housing of the rack, and remote bundles that can connect to a different rack but can also connect within the local housing. The bundles being a group of cables.

The cabling system may be split into two groups, wherein the first group of cables which are not used for expansion are secured to the right side of the cable housing and the second group of cables which are used for expansion are secured to the left side of the cable housing or the cable housing side wall. Of course, the left and right can be swapped in other embodiments. The cable housing being an enclosure on the side of the rack for storing and securing cables. In racks where multiple systems are stored, the cabling system can support both top-to-bottom and bottom-to-top expansion to allow the user a point of flexibility depending on the users particular rack setup. In order to constrain the cables to one path, hooks on both the left and right side of the cable housing are placed in particular positions. The cable combs and hooks guide the cables through the three-dimensional path through space in an optimal route as to allow the previously mentioned features. Within the local (non-expansion) and remote (expansion) cable groups, cable channels are maintained near the faceplate to facilitate the installation steps and minimize confusion when attempting to remove/replace a single cable amongst the plurality of total cables. When a cable exits the angled faceplate, the first cable support is a cable comb which has grooves for individual cables. This keeps the cables organized at the faceplate, eliminating tangles and undiscernible groups of cables.

FIG. 1 is a perspective view of a network rack 100 including the cable management topology of the present disclosure. The rack 100 includes a cable housing 102. The cable housing 102 includes a plurality of hooks 104, the hooks 104 adapted to secure and guide cables through the cable housing 102. The hooks are placed as to secure both the cables which will not be used in expansion and cables which will be used in expansion. The cables not used in expansion being secured by the hooks 104 on the inner side (right side) of the cable housing 102, and the cables used in expansion being secured to the outer side (left side) of the cable housing 102 by the hooks 104. This reduces the amount of cable bulk in a given area, making it much simpler to track a single cable. The plurality of cables may include any of twinaxial cables, fiber cables, and other cables of the like.

Figure 2:
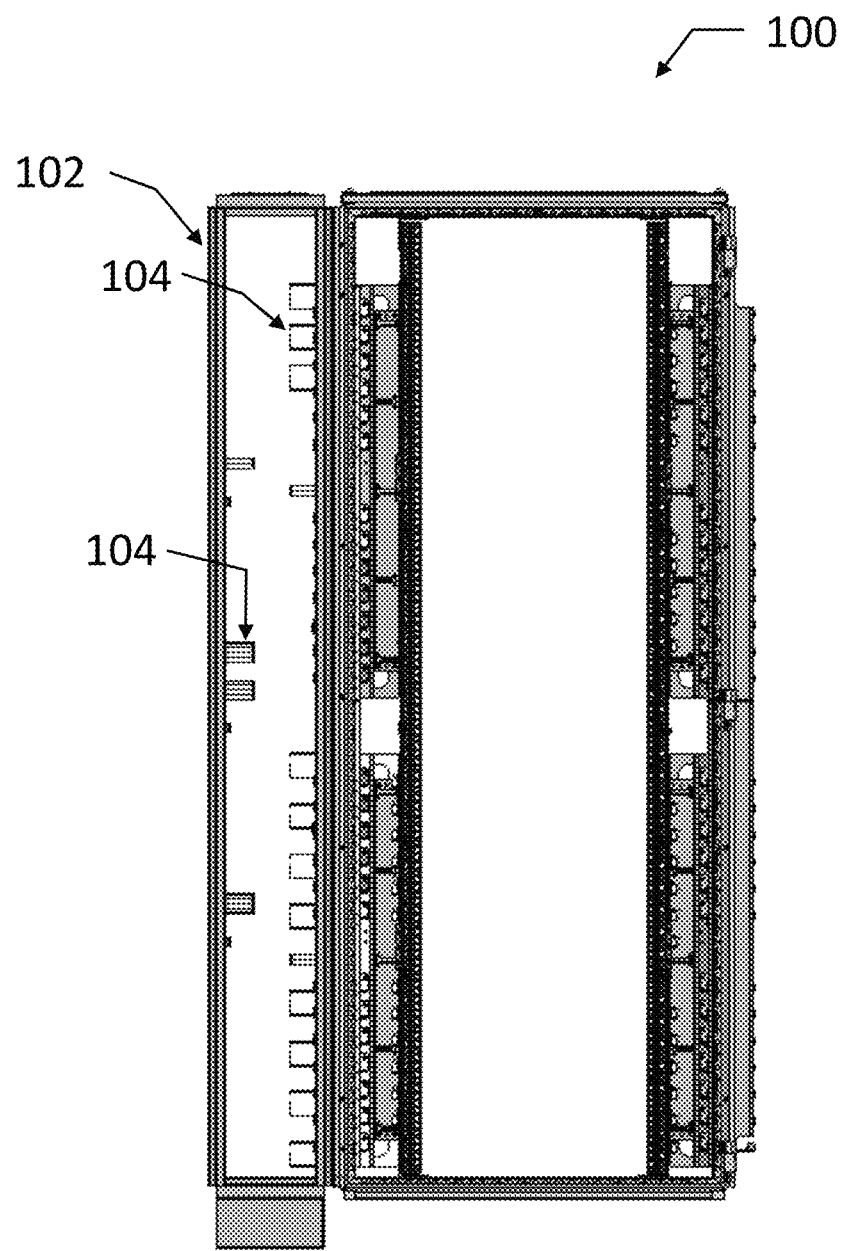
FIG. 2 is a front view of a rack including the cable management topology of the present disclosure.

FIG. 2 is a front view of a network rack 100 including the cable management topology of the present disclosure. Again, the rack 100 includes a cable housing 102. The cable housing 102 includes a plurality of hooks 104, the hooks 104 adapted to secure and guide cables through the cable housing 102.

Figure 3:
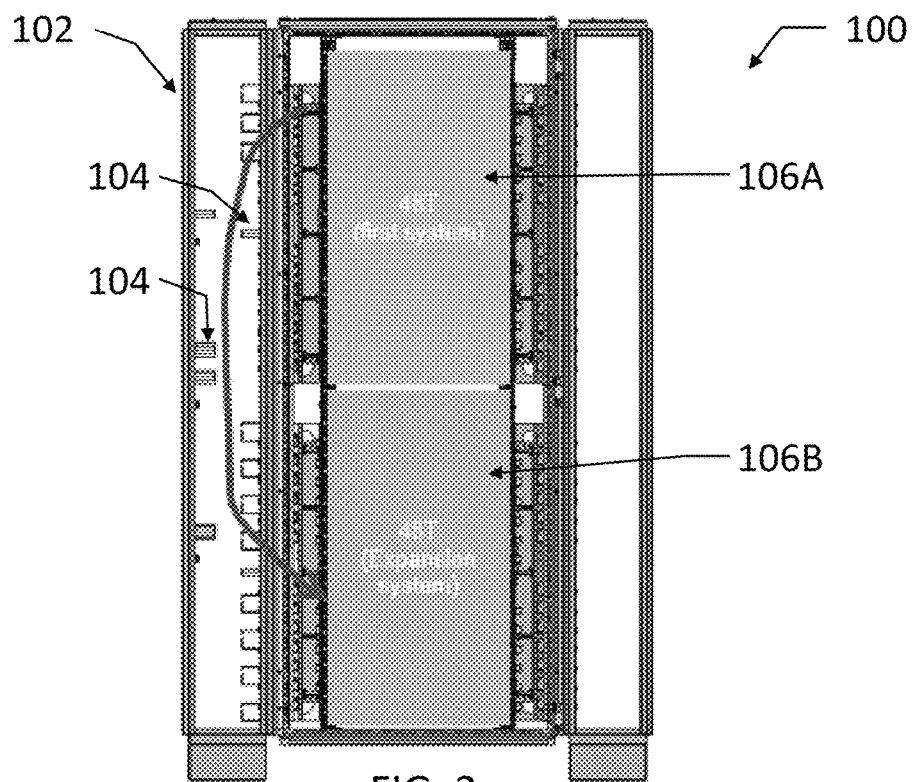
FIG. 3 is a diagram of a rack including a first system and an expansion system, both systems disposed in the same rack.

FIG. 3 is a diagram of a network rack 100 including a first system 106A and an expansion system 106B, both systems disposed in the same rack 100. The expansion shown in FIG. 3 shows how a rack 100 may include a plurality of systems, one being a first system 106A and another being an expansion system 106B (second system). In this embodiment, cables for interconnection of components in each system will be secured to the right side of the cable housing 102 via the hooks 104, and cables for connecting the first and second systems together will be secured to the left side of the cable housing 102 via the hooks 104. The expansion depicted in FIG. 3 is a top-to-bottom expansion, meaning the first system 106A is above the expansion system 106B. The expansion cables will travel from the first system 106A down to the expansion system 106B via the hooks 104 disposed on the left side (outer wall) of the cable housing 102. The cable hooks 104 guide the cables through the three-dimensional path through space in the cable housing 102 in an optimal path as to allow the cables to be accessed easily such as in a rack 100 allowing only front and rear access, while also allowing a single cable to be removed and replaced without disrupting other components or cables.

It will be appreciated that the rack 100 depicted in FIG. 3 shows a stacked system setup with the expansion system 106B below the first system 106A. In other embodiments, the systems may be in a different orientation, such as the expansion system 106B being positioned above the first system 106A. The example depicted in FIG. 3 shall be construed as a non-limiting example.

Figure 4:
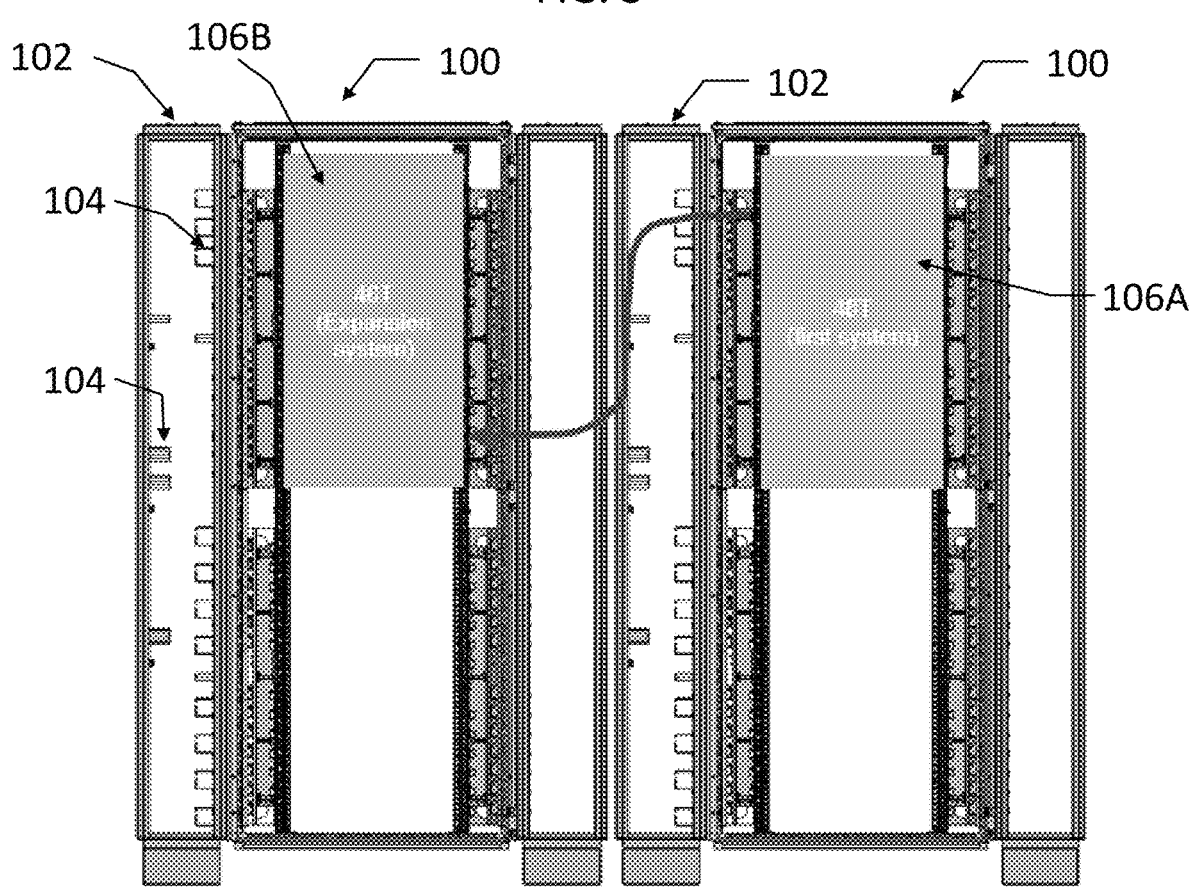
FIG. 4 is a diagram of a rack including a first system and an expansion system, both systems disposed in different racks.

FIG. 4 is a diagram of a network rack 100 including a first system 106A and an expansion system 106B, both systems disposed in different racks 100. The expansion shown in FIG. 4 shows how a plurality of racks 100 may be placed adjacent to one another and both house systems, one being a first system 106A and another being an expansion system 106B (second system) in a separate rack 100. In this embodiment, cables for interconnection of components in each system will be secured to the right side of the cable housing 102 via the hooks 104 in the rack 100 of the respective system, and cables for connecting the first 106A and second 106B systems together will be secured to the left side of the cable housing 102 via the hooks 104. The expansion depicted in FIG. 4 is an expansion including a plurality of racks 100, meaning the first system 106A is in a different rack 100 than expansion system 106B. The expansion cables will travel from the first system 106A to the expansion system 106B via the hooks 104 disposed on the left side (outer wall) of the cable housing 102. The cable hooks 104 guide the cables through the three-dimensional path through space in the cable housing 102 and to the adjacent rack 100 in an optimal path as to allow the cables to be accessed easily such as in a rack 100 allowing only front and rear access, while also allowing a single cable to be removed and replaced without disrupting other components or cables.

It will be appreciated that the plurality of racks 100 depicted in FIG. 4 shows an adjacent system setup with the expansion system 106B next to the first system 106A. In other embodiments, the systems may be in a different orientation, such as the expansion system 106B being positioned on a different side than the first system 106A. The example depicted in FIG. 4 shall be construed as a non-limiting example.

Figure 5A:
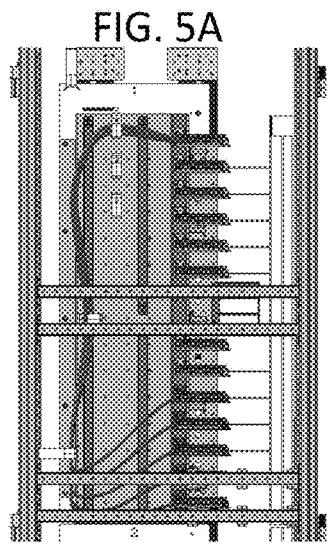
FIG. 5A-5H are diagrams showing the connection of the non-expansion cables on a first system disposed within a rack.
Figure 5B:
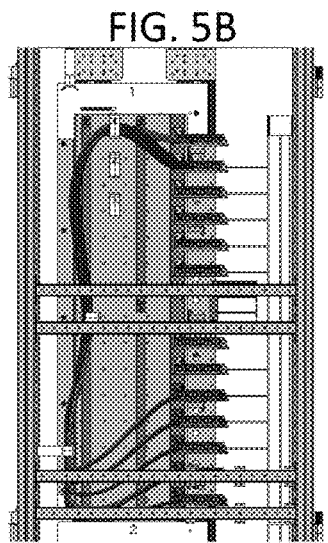
Figure 5C:
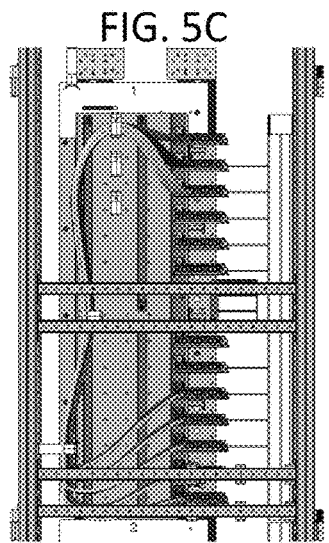
Figure 5D:
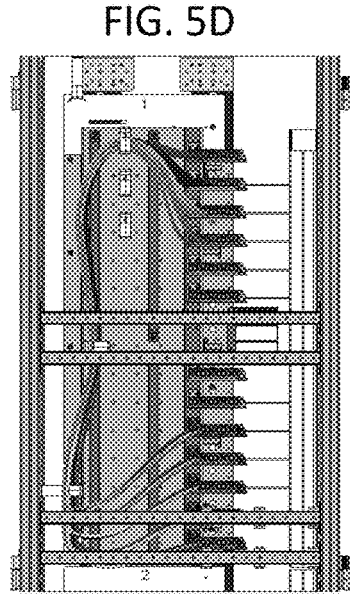
Figure 5E:
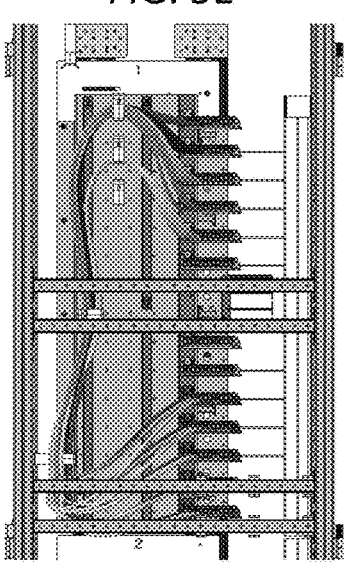
Figure 5F:
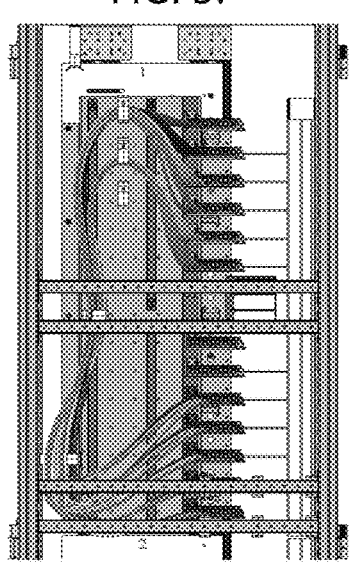
Figure 5G:
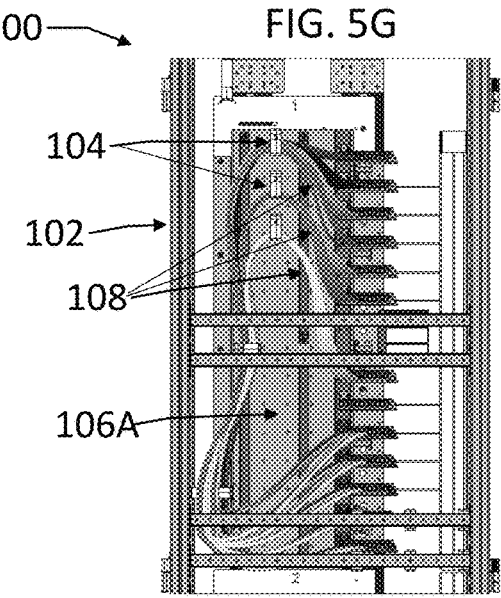
Figure 5H:
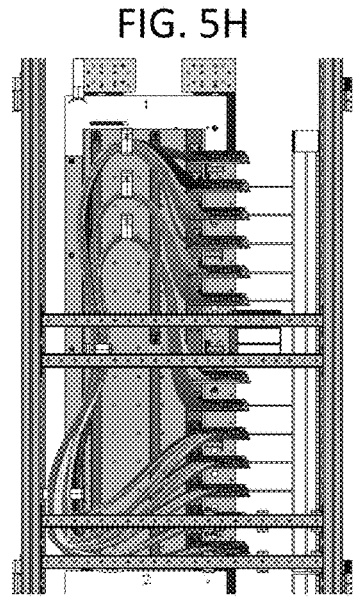

FIG. 5A-5H are diagrams showing the connection of the non-expansion cables 108 on a first system disposed within a cable housing 102 of a rack 100. Each of these non-expansion cables 108 may be a bundle of cables or a single cable. The view is a side view, displaying the side of the cable housing 102. FIG. 5A is a first system 106A including one set of non-expansion cables 108 and FIG. 5H is the same first system 106A including all of the non-expansion cables 108. Thus, FIG. 5A-5H each show the addition of a set of non-expansion cables 108 and how they are routed through the cable housing 102 via the plurality of hooks 104. All of the non-expansion cables 108 are the same length as to simplify the supply and maintenance of the system as a whole. In order to constrain the non-expansion cables 108 to one path, the hooks 104 on the right side (the side closest to the system 106A) of the cable housing 102 are placed in particular positions. The cable hooks 104 guide the non-expansion cables 108 through the three-dimensional path in an optimal route as to allow the non-expansion cables 108 to be accessed easily.

By splitting up the non-expansion cables 108 from expansion cables 112 (FIG. 8A-8H) into different sides of the cable housing 102, congestion is reduced to aid in cable access. This is crucial in cases where the removal and replacement of a cable must be performed due to a cable failure. In addition to the hooks 104 used to rout the cables, cable tie downs may also be utilized to further secure and route the cables into the desired path and destination, the tie downs being integrated into the hooks 104 or separate components.

Figure 6A:
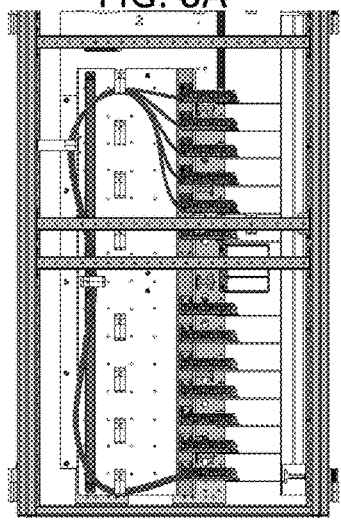
FIG. 6A-6H are diagrams showing the connection of the non-expansion cables on a second system disposed within a rack.
Figure 6B:
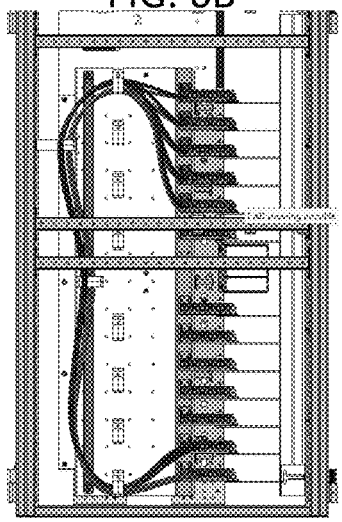
Figure 6C:
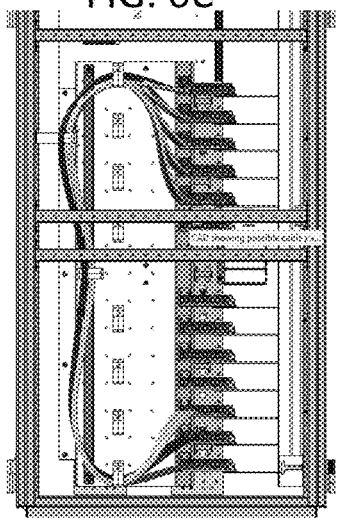
Figure 6D:
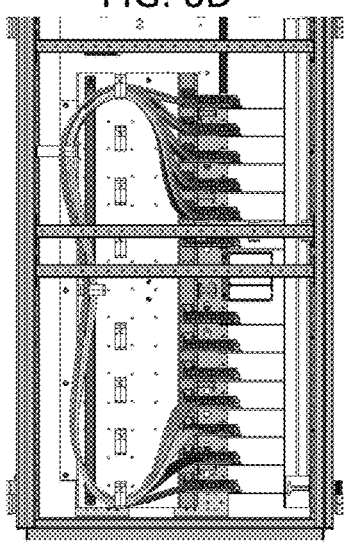
Figure 6E:
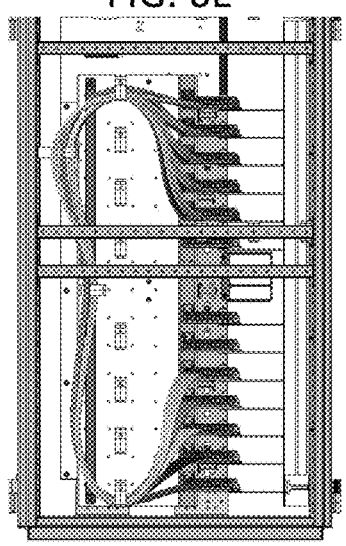
Figure 6F:
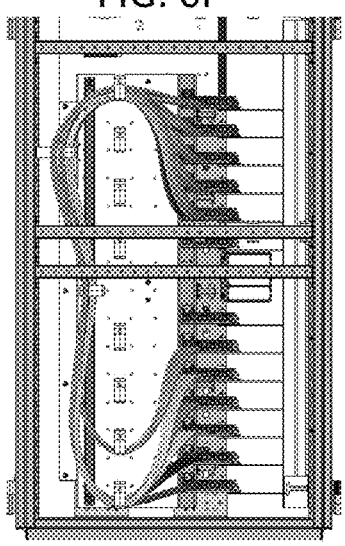
Figure 6G:
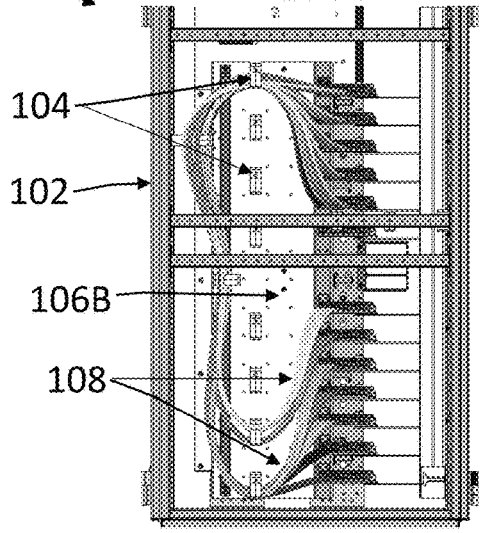
Figure 6H:
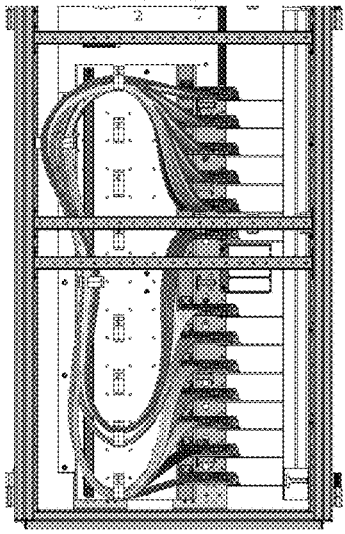

FIG. 6A-6H are diagrams showing the connection of the non-expansion cables 108 on an expansion system 106B disposed within a cable housing 102 of a rack 100. The cable housing 102 of the rack 100 is the same cable housing 102 as shown in FIG. 5A-5H, representing a stacked expanded rack 100 as described in FIG. 3. The expansion system 106B is disposed below the first system 106A. The view shown is a side view, displaying the side of the cable housing 102. FIG. 6A is the expansion system 106B including one set of non-expansion cables 108 and FIG. 6H is the same expansion system 106B including all of the non-expansion cables 108. Thus, FIG. 6A-6H each show the addition of a set of non-expansion cables 108 and how they are routed through the cable housing 102 via the plurality of hooks 104. Again, all of the non-expansion cables 108 are the same length as to simplify the supply and maintenance of the system as a whole. In order to constrain the non-expansion cables 108 to one path, the hooks 104 on the right side (the side closest to the system 106B) of the cable housing 102 are placed in particular positions. The cable hooks 104 guide the non-expansion cables 108 through the three-dimensional path in an optimal route as to allow the non-expansion cables 108 to be accessed easily in the case of necessary maintenance or other tasks.

Again, by splitting up the non-expansion cables 108 from the expansion cables 112 (FIG. 8A-8H) into different sides of the cable housing 102 on both the first system 106A and the expansion system 106B, congestion is reduced to aid in cable access. This is crucial in cases where the removal and replacement of a cable must be performed due to a cable failure. In addition to the hooks 104 used to route the cables, cable tie downs may also be utilized to further secure and route the cables into the desired path and destination, the tie downs being integrated into the hooks 104 or separate components.

FIG. 7A-7B are diagrams showing a first system 106A and an expansion system 106B with non-expansion cables 108 disposed within a cable housing 102 of a rack 100. FIG. 7A shows a front view of the rack 100 and the cable housing 102. FIG. 7B shows a side view of the cable housing 102 including all of the non-expansion cables 108 disposed within. The non-expansion cables 108 can be seen secured to the right side (the side closer to the system) of the cable housing 102. The hooks 104 on the right side of the cable housing 102 are used to secure and guide the non-expansion cables 108, allowing all of the cables to be the same length by taking up the slack of the cables with the hooks 104.

In various embodiments, the cable housing 102 may further include a plurality of tie down bars 110 to further secure the cables to the system. Additional hooks 104 may be positioned in further locations to take up any additional slack in the cables. It will be appreciated that the rack 100 depicted in FIG. 7 shows a stacked system setup with the expansion system 106B below the first system 106A. In other embodiments, the systems may be in a different orientation, such as the expansion system 106B being positioned above the first system 106A or the expansion system 106B being located in a separate rack 100 positioned adjacent to the first rack 100. The example depicted in FIG. 7 shall be construed as a non-limiting example.

Figure 8A:
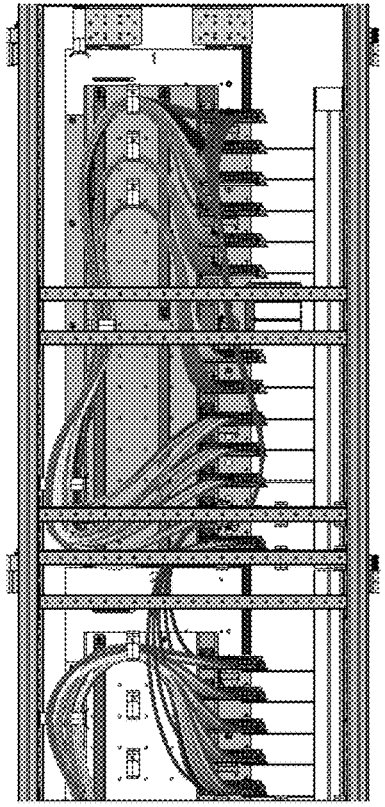
FIG. 8A-8H are diagrams showing the connection of expanded cables on a first and second system disposed within a rack.
Figure 8B:
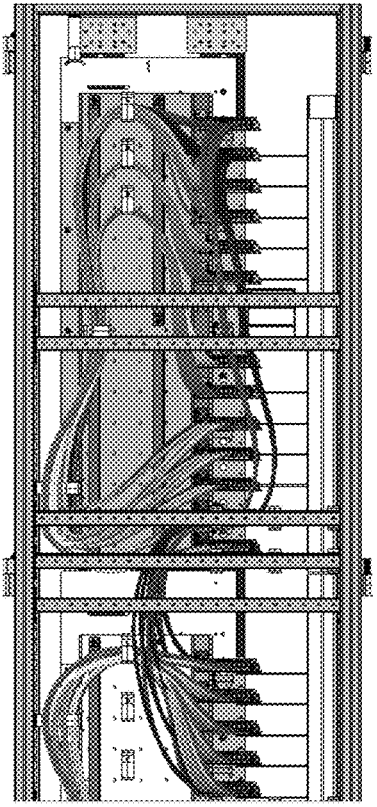
Figure 8C:
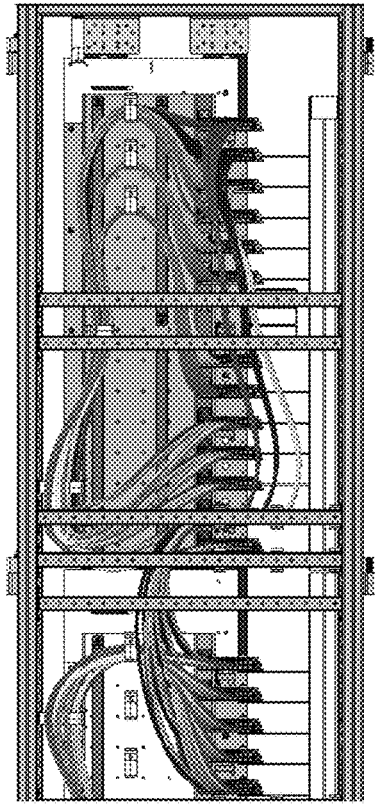
Figure 8D:
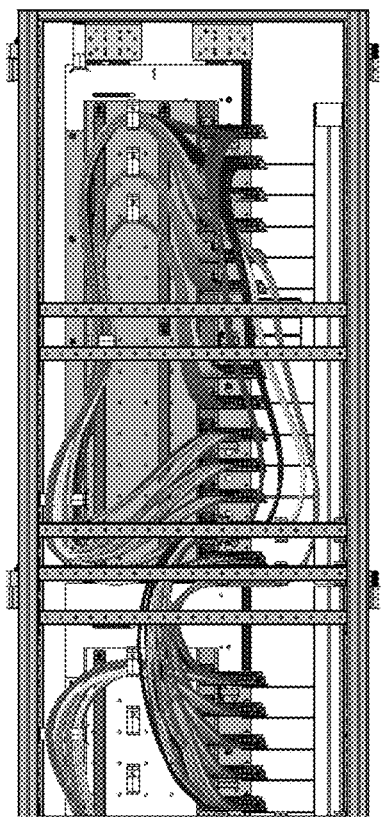
Figure 8E:
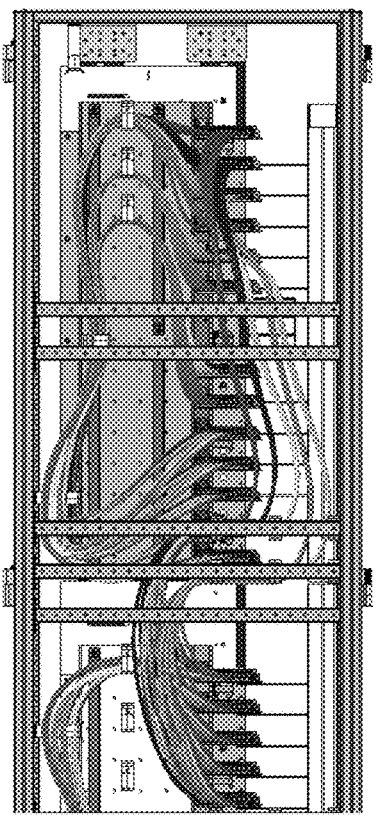
Figure 8F:
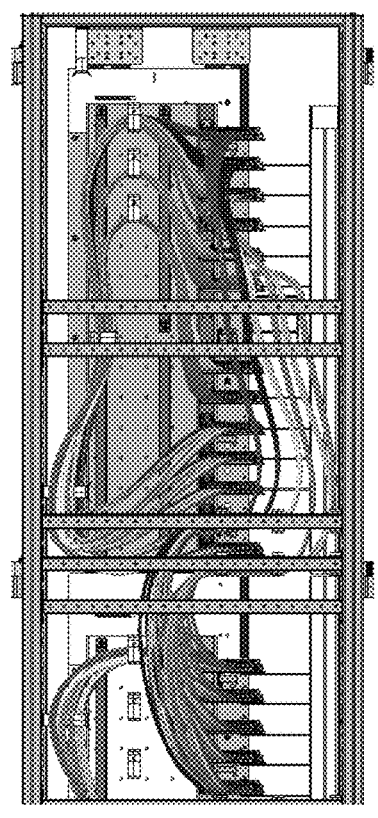
Figure 8G:
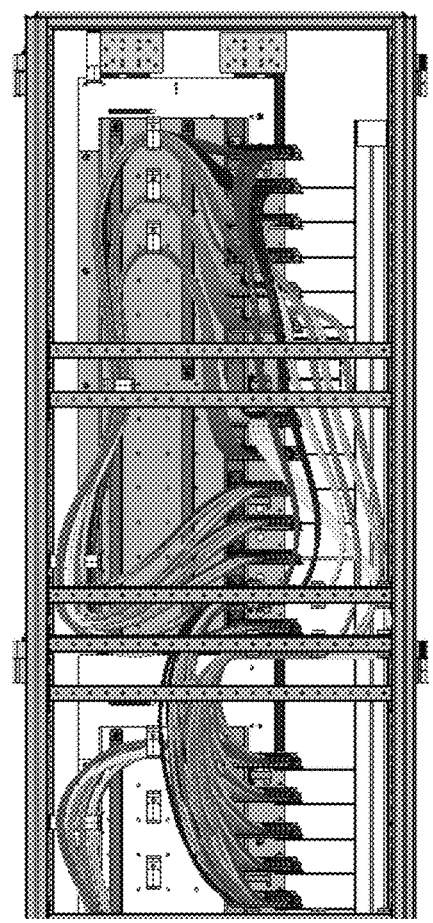
Figure 8H:
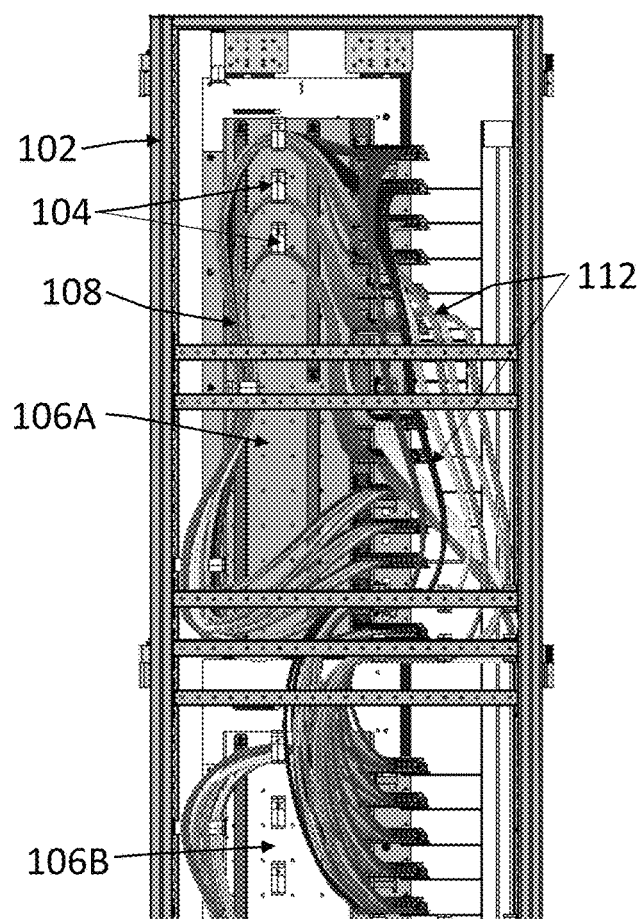

FIG. 8A-8H are diagrams showing the connection of expansion cables 112 on a first system 106A and second (expansion) system 106B disposed within a cable housing 102 of a rack 100. Each of these expansion cables 108 may be a bundle of cables or a single cable. The cable housing 102 of the rack 100 represents a stacked expanded rack 100 as described in FIG. 3. The expansion system 106B is disposed below the first system 106A. The view shown is a side view, displaying the side of the cable housing 102 of the rack 100. FIG. 8A shows one set of expansion cables 112 connecting the first system 106A to the expansion system 106B. FIG. 8H shows all of the expansion cables 112 connecting the first system 106A to the expansion system 106B, thus FIG. 8A-8H each show the addition of a set of expansion cables 112 and how they are routed through the cable housing 102 via the plurality of hooks 104.

In various embodiments, the expansion cables 112 are all of the same length to simplify the system and the supply of parts. Further, the expansion cables 112 may be the same length as the non-expansion cables 108 to further simplify the system. Again, any slack of the expansion cables 112 and non-expansion cables 108 is managed by the plurality of hooks 104 and tie down bars 110. It shall be appreciated that the example expansion shown in FIG. 8A-8H is a depiction of a stacked expansion. Various embodiments may include an expansion system 106B disposed in a different rack 100, being coupled via the expansion cables 112. Further, various embodiments may include a plurality of expansion systems 106B, disposed in both the same rack 100 and different racks 100.

Figure 9:
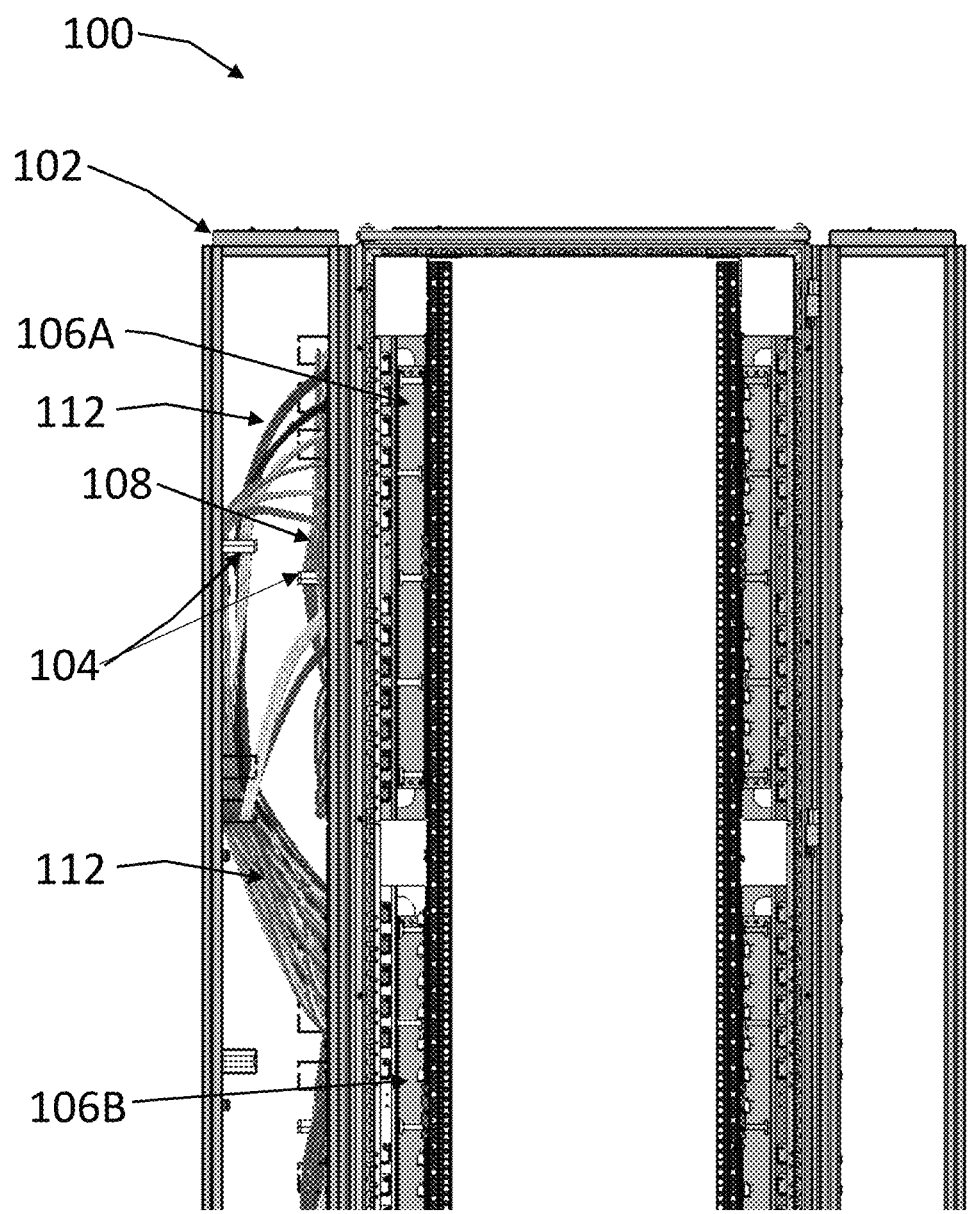
FIG. 9 is a diagram showing a first and second system with expanded cables disposed within a rack.

FIG. 9 is a diagram showing a first 106A and second 106B system with expansion cables 112 disposed within a rack 100. A cable housing 102 houses both the non-expansion cables 108 and the expansion cables 112. The expansion cables 112 are secured and routed along the left (outer side) side of the cable housing 102 while the non-expansion cables 108 are routed and secured to the right side (side closer to the system 106A and 106B) of the cable housing 102 via the plurality of hooks 104. Again, by splitting up the non-expansion cables 108 from the expansion cables 112 into different sides of the cable housing 102, congestion is reduced to aid in cable access and cable maintenance.

Figure 10A:
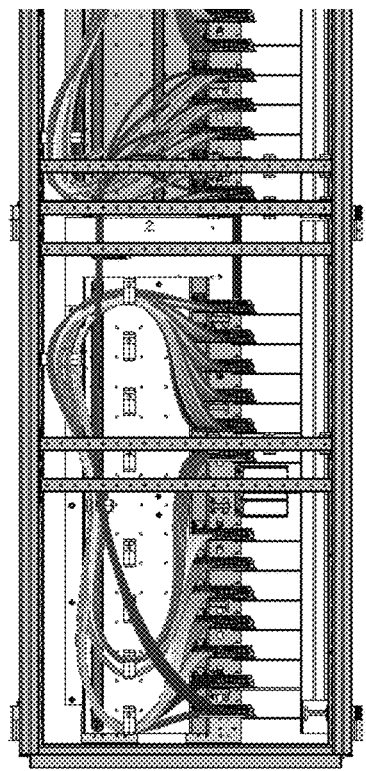
Figure 10B:
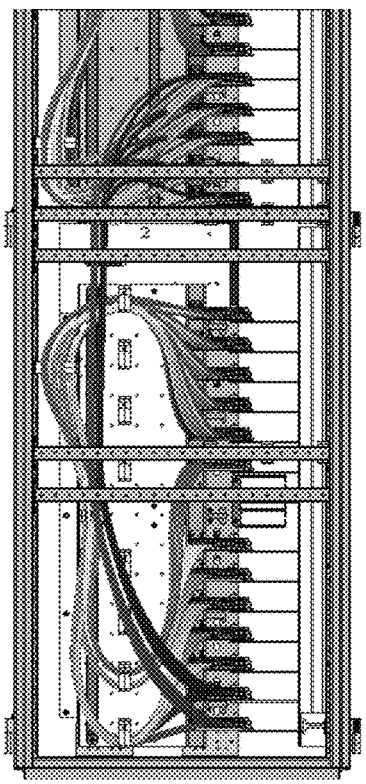
Figure 10C:
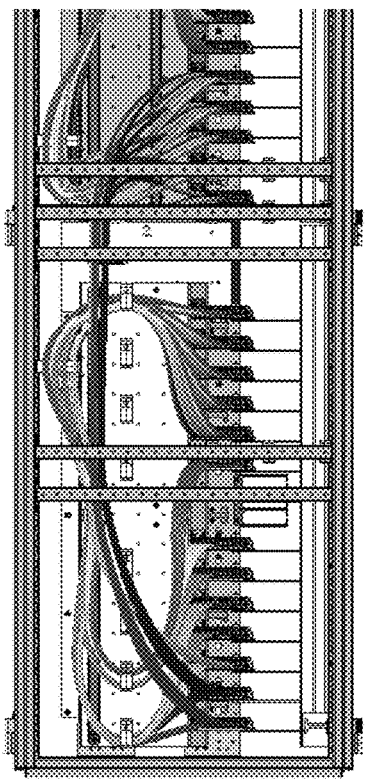
Figure 10D:
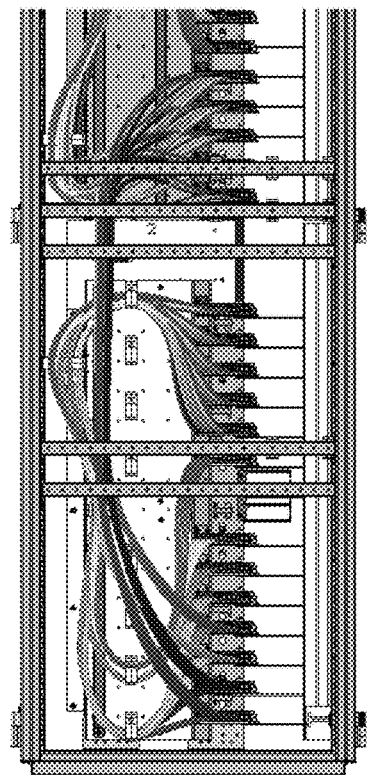
Figure 10E:
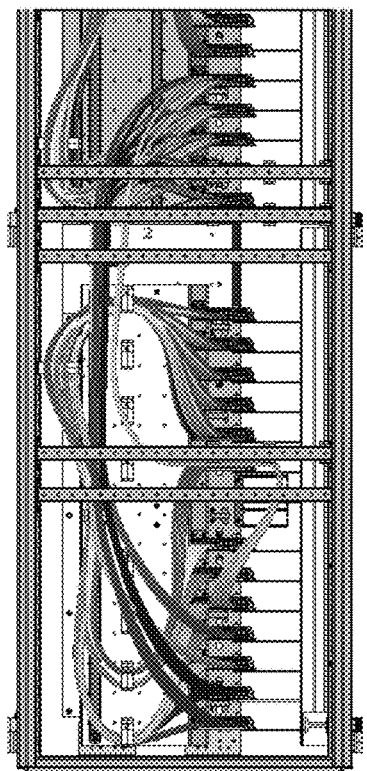
Figure 10F:
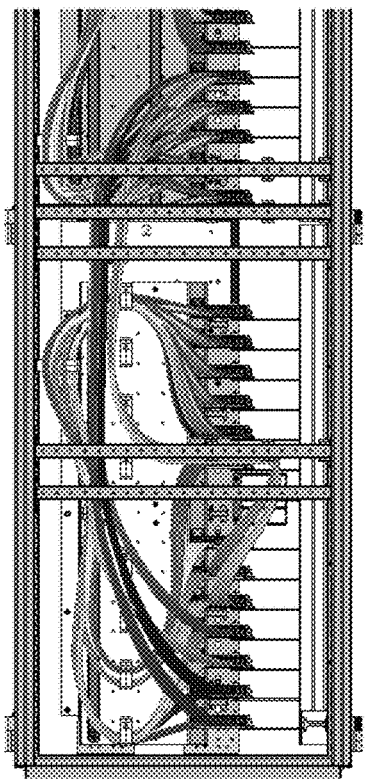

FIG. 10A-10H are diagrams showing the connection of additional expansion cables 112 on a first system 106A and second (expansion) system 106B disposed within a cable housing 102 of a rack 100. The view shown is a side view, displaying the side of the cable housing 102 of the rack 100. FIG. 10A shows one set of additional expansion cables 112 connecting the expansion system 106B to the first system 106A. FIG. 10H shows all of the additional expansion cables 112 connecting the expansion system 106B to the first system 106A, thus FIG. 10A-10H each show the addition of a set of expansion cables 112 and how they are routed through the cable housing 102 via the plurality of hooks 104 in a stacked expansion setup.

Again, in various embodiments, the expansion cables 112 are all of the same length to simplify the system and the supply of parts. Further, the expansion cables 112 may be the same length as the non-expansion cables 108 to further simplify the system and the maintenance of the system by only requiring a single cable length for any cable replacement.

Figure 11:
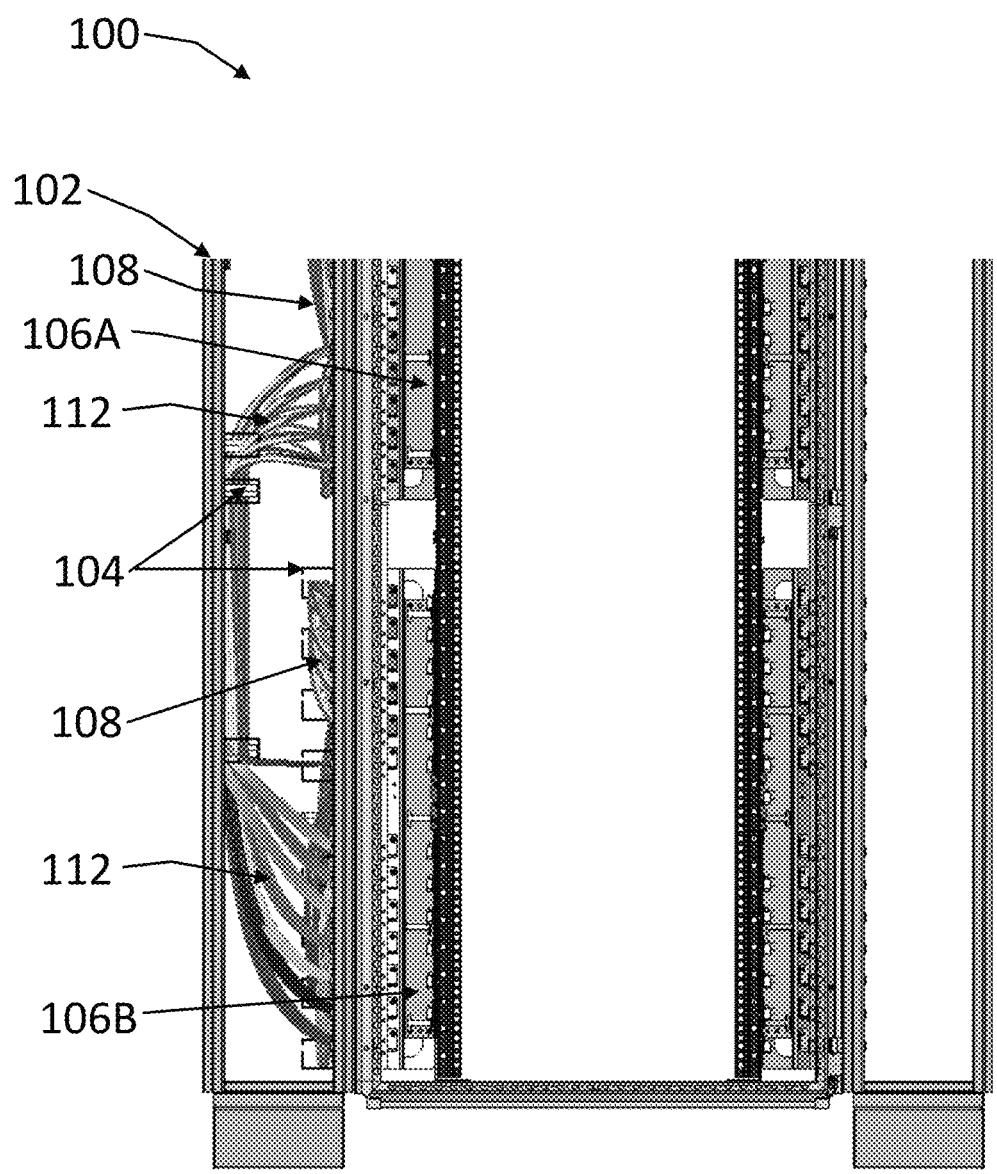
FIG. 11 is a diagram showing a first and second system with expanded cables disposed within a rack.

FIG. 11 is a diagram showing a first 106A and second 106B system with expansion cables 112 disposed within a rack 100. The view being the bottom portion of the rack 100 displaying a second group of expansion cables 112. The cable housing 102 houses both the non-expansion cables 108 and the expansion cables 112. The expansion cables 112 are secured and routed along the left (outer side) of the cable housing 102 while the non-expansion cables 108 are routed and secured to the right side (side closer to the system 106A, 106B) of the cable housing 102 via the plurality of hooks 104 similarly to the upper portion of the cable housing 102. Again, by splitting up the non-expansion cables 108 from the expansion cables 112 into different sides of the cable housing 102, congestion is reduced to aid in cable access and cable maintenance.

FIG. 12A-12B are diagrams showing a first 106A and second 106B system with all expansion cables 112 and non-expansion cables 108 disposed within a cable housing 102 of a rack 100. FIG. 12A shows a front view of the rack 100 and the cable housing 102. FIG. 12B shows a side view of the cable housing 102 including all of the non-expansion cables 108 and expansion cables 112 coupling the systems (106A, 106B). The non-expansion cables 108 can be seen secured to the right side (the side closer to the system) of the cable housing 102 as shown in previous FIG. 11 and FIG. 9, thus being secured out of the way of the expansion cables 112. The hooks 104 on the right side of the cable housing 102 are used to secure and guide the non-expansion cables 108, allowing all of the cables to be the same length by taking up the slack of the cables with the hooks 104. The expansion cables 112 can be seen secured to the left side (the outer side) of the cable housing 102. The hooks 104 on the left side of the cable housing 102 are used to secure and guide the expansion cables 112. In various embodiments, the expansion cables 112 and the non-expansion cables 108 are all of the same length, thus greatly reducing the complexity and supply for maintenance.

In various embodiments, the cable housing 102 may further include a plurality of tie down bars 110 to further secure the cables to the system. Additional hooks 104 may be positioned in further locations to take up any additional slack in the cables (non-expansion cables 108 and expansion cables 112). It will be appreciated that the rack 100 depicted in FIG. 12 shows another stacked system setup with the expansion system 106B below the first system 106A. In other embodiments, the systems may be in a different orientation, such as the expansion system 106B being positioned above the first system 106A or the expansion system 106B being located in a separate rack 100 positioned adjacent to the first rack 100. The example depicted in FIG. 12 shall be construed as a non-limiting example.

Figure 13:
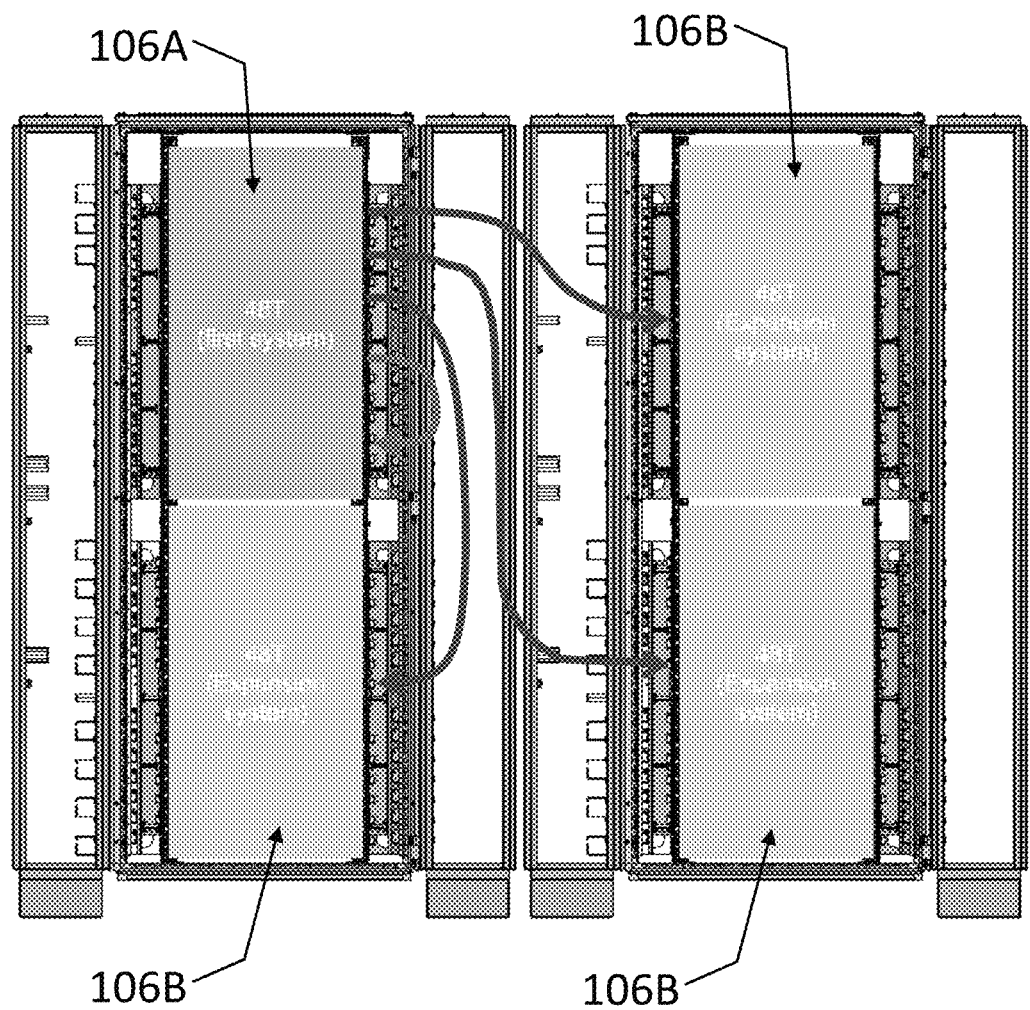
FIG. 13 is a diagram showing a combination of system expansions including a same rack expansion and an additional rack expansion.

FIG. 13 is a diagram showing a combination of system expansions including a same rack expansion (vertical expansion) and an additional rack expansion (horizontal expansion). Various embodiments of the cabling topology system of the present disclosure can accommodate different expansion schemes such as the vertical expansion and horizontal expansion shown in FIG. 13. The expansion cables 112 are used to couple the various expansion systems 106B to the first system 106A, all of the cables being the same length. The cable topology system of the present disclosure utilizes cables of the same length, no matter the expansion type, to simplify cable management and maintenance by managing cable slack with the plurality of hooks 104 and tie down bars 110.

Figure 14:
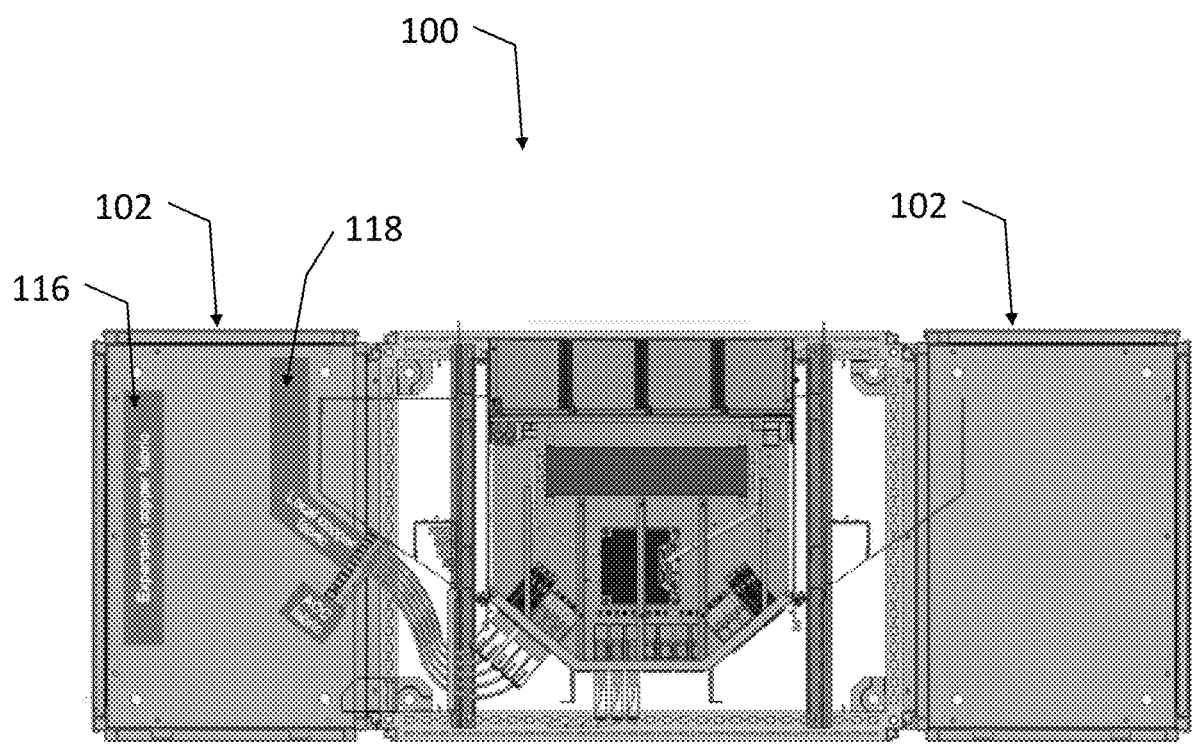
FIG. 14 is a top view diagram of a rack including the cable management topology of the present disclosure.

FIG. 14 is a top view diagram of a rack including the cable management topology of the present disclosure. The view shown in FIG. 14 demonstrates the separation between the non-expansion cables 108 and the expansion cables 112 in the cable housing 102 of the rack 100. The non-expansion cables 108 and the expansion cables 112 are secured and routed by the plurality of hooks 104 and/or combs 114 (FIG. 15), both of which allow the cables to be accessed individually without interruption of other cables, allowing a user to replace any cable in the system with ease. The different cables are separated into different zones including the expansion zone 116 and the local zone 118. The expansion zone 116 being the space allocated for the expansion cables 112, and the local zone 118 being the space allocated for the non-expansion cables 108. As stated herein, the expansion zone 116 is located on the left side (outer side) of the cable housing 102, while the local zone 118 is located on the right side (side closest to the system 106A, 106B) of the cable housing 102.

The rack 100 shown in FIG. 14 also shows a system (106A, 106B) disposed in the rack 100. Such systems (devices) may include servers, computing devices, routers, switches, and others of the like. The rack 100 further includes a second cable housing 102 on the right side as shown in FIG. 14. The second cable housing 102 may be utilized if an expansion system is located on the right side of the rack 100, similar to the depiction in FIG. 13.

Figure 15:
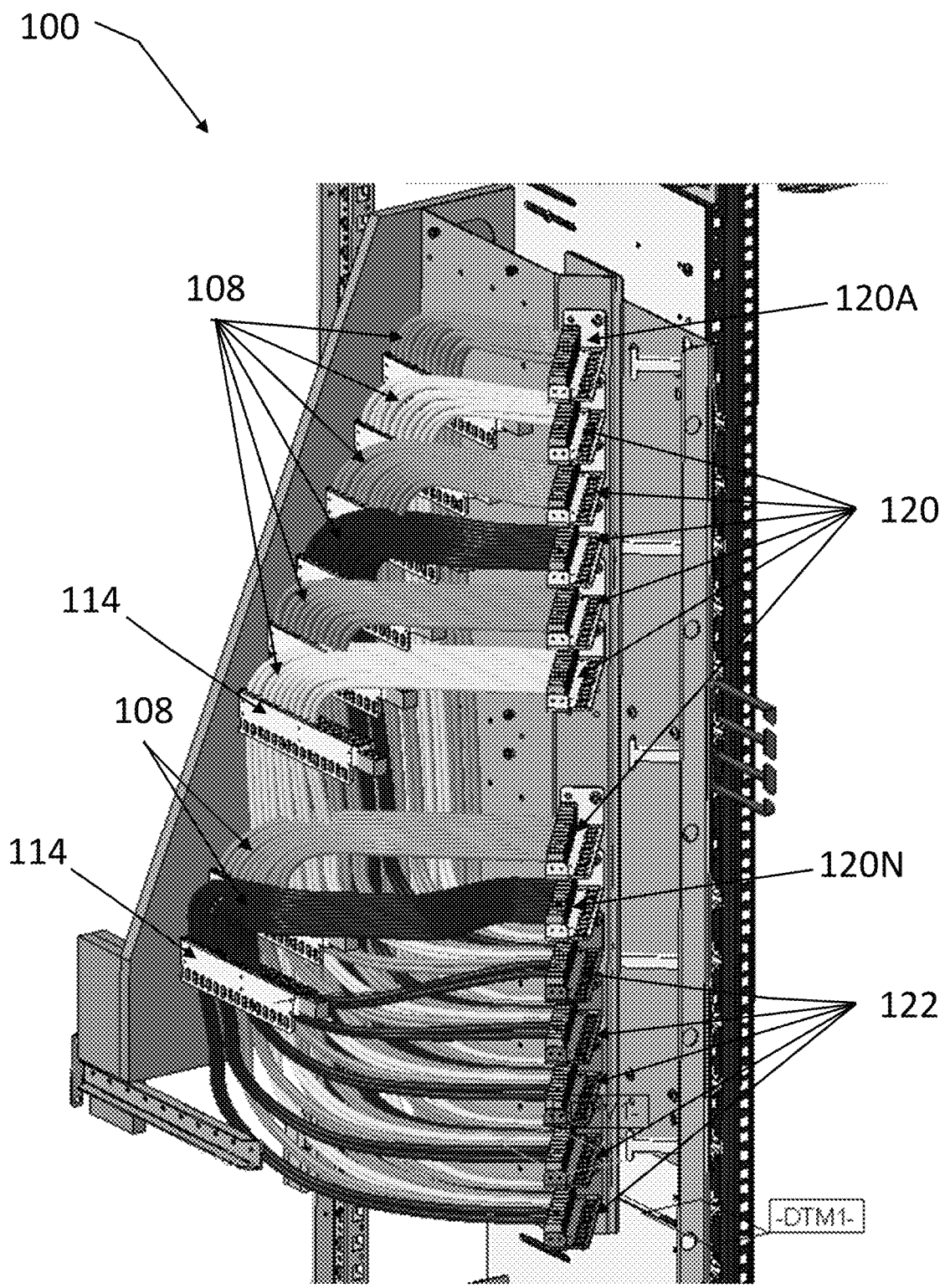
FIG. 15 is a diagram of a rack including a top-down cable topology of the present disclosure.

FIG. 15 is a diagram showing the inside of the cable housing 102 of a rack 100 including a top-down cable topology of the present disclosure. The topology shown can be utilized for the expansion cables 112 as well as the non-expansion cables 108. The figure shows the non-expansion cables 108 secured and managed by this top-down cable topology, utilizing a plurality of combs 114. It will be appreciated that various embodiments may utilize the combs 114 shown in FIG. 15, or hooks 104, or a combination of the two as well as a plurality of angled combs (120, 122). The installation process for coupling the different slots of the system (106A, 106B), utilizing the top-down cable topology begins with routing the cable for the top most slot through the first angled comb 120A, routing the cables through their corresponding comb 114, and coupling the cables to their destination slots through the angled destination comb 122. Subsequent cables (108, 112) are coupled in order from top to bottom, the last connection being the bottom most slot routed through the bottom most angled comb 120N.

It will be appreciated that the cabling topology of the present disclosure may utilize a plurality of combs 114 or hooks 104 for each cable, in order to take up slack or alleviate cable congestion.

Figure 16:
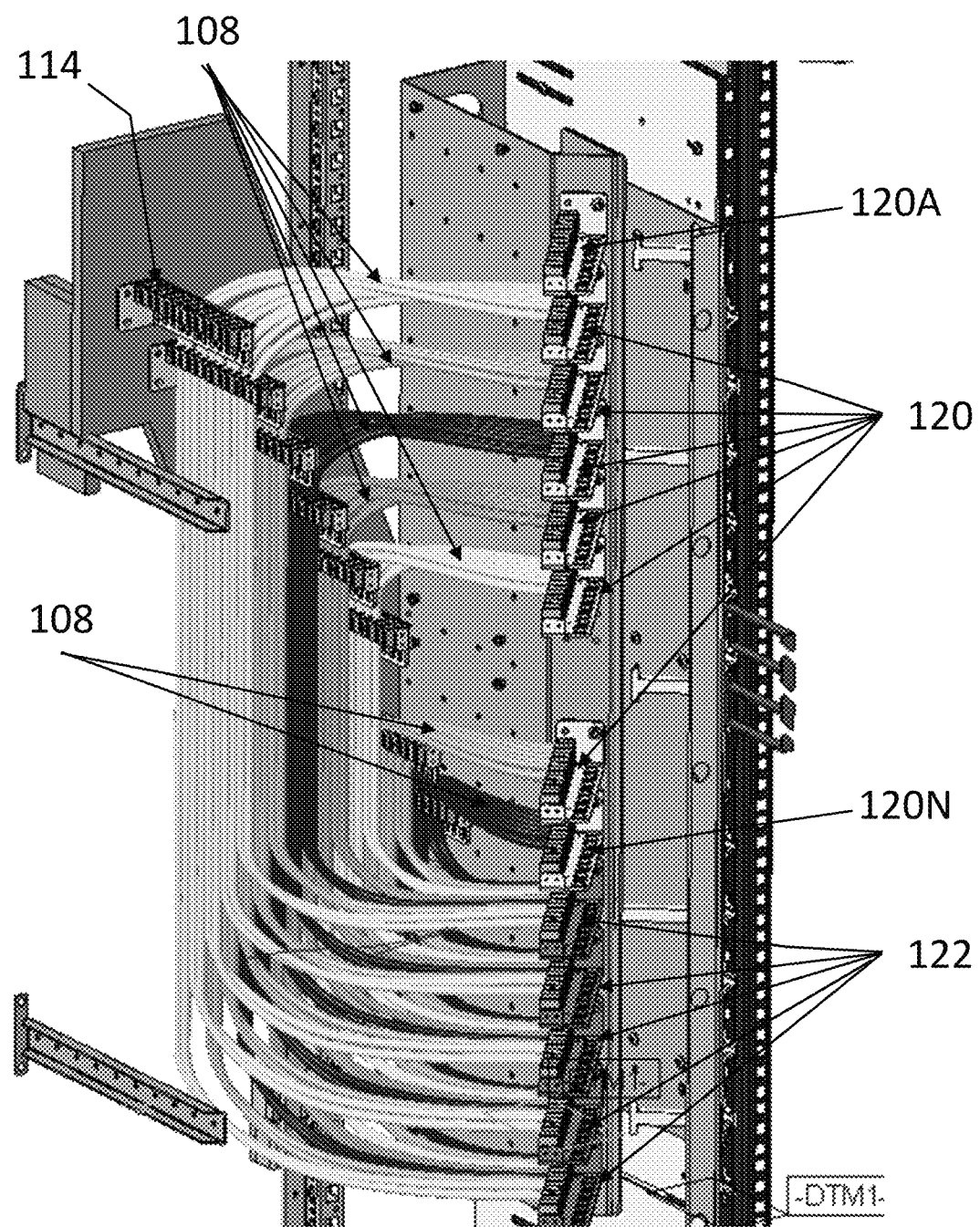
FIG. 16 is a diagram of a rack including a bottom-up cable topology of the present disclosure.

FIG. 16 is a diagram showing the inside of the cable housing 102 of a rack 100 including a bottom-up cable topology of the present disclosure. The cable topology shown in FIG. 16 can be utilized for the routing of expansion cables 112 as well as the non-expansion cables 108. The present figure shows the non-expansion cables 108 secured and managed by the bottom-up cable topology, utilizing a plurality of combs 114. Again, it will be appreciated that various embodiments may utilize the combs 114 shown in FIG. 16, or hooks 104, or a combination of the two. The installation process for coupling the different slots of the system (106A, 106B), utilizing the bottom-up cable topology begins with routing the cable for the bottom most slot through the bottom most angled comb 120N, routing the cables through their corresponding comb 114, and coupling the cables to their destination slots through the angled destination comb 122. Subsequent cables (108, 112) are coupled in order from bottom to top, the last connection being the top most slot routed through the top most angled comb 120A.

Again, it will be appreciated that the cabling topology of the present disclosure may utilize a plurality of combs 114 or hooks 104 for each cable, in order to take up slack or alleviate cable congestion.

Figure 17A:
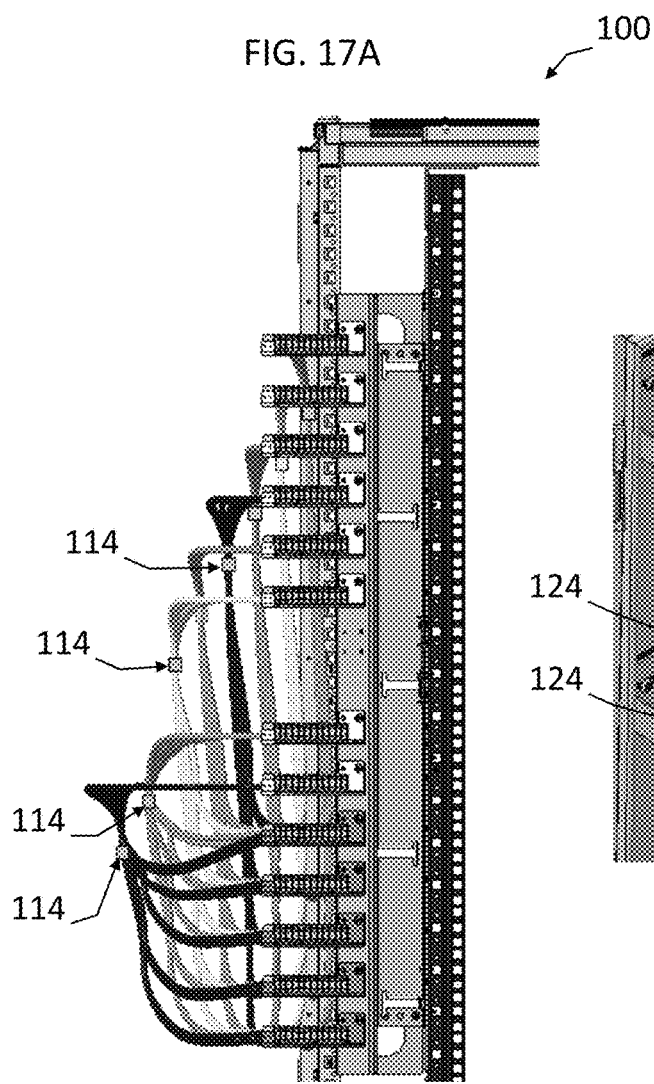
FIG. 17A-17B are diagrams showing a ribbon style cable securement system of the present disclosure.
Figure 17B:
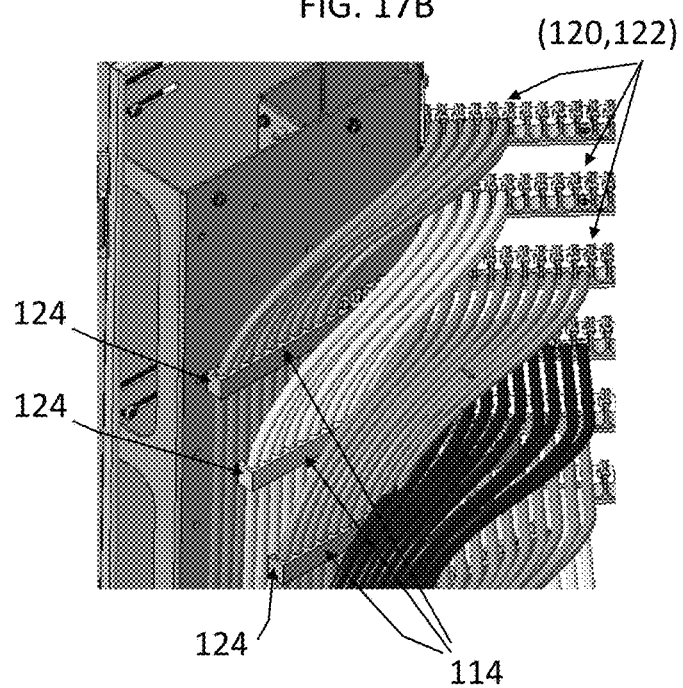

FIG. 17A-17B are diagrams showing a ribbon style (comb 114) cable securement system of the present disclosure. FIG. 17A shows the staircase layout of the combs 114 disposed within the cable housing 102 of the rack 100. The walls of the cable housing 102 have been removed to show the cable topology in greater detail. It can be seen that the staircase layout of the combs 114 allow the cables (108, 112) to be secured and routed in a way as to allow each cable to be easily accessed after instillation. The cabling topology shown in FIG. 17A shows a top-down cable topology, but is shall be appreciated that the bottom-up cable topology described herein can also be utilized with the combs 114. The combs 114 described herein may be any commercially available cable comb or cable management device of the like.

FIG. 17B shows a closer view of the combs 114, and how the cables (108, 112) are routed and secured through the combs 114. The combs 114 allow each cable (108, 112) to be secured individually, thus allowing access to any cable in the system. The combs 114 are also adapted to take up any slack in the cables (108, 112), eliminating any cable congestion. In various embodiments, the combs 114 are secured to the structure of the cable housing 102. The present embodiment shows the combs secured to the rear inner face of the cable housing 102 via the mounting surface 124 of the combs 114 (the rear inner face of the cable housing 102 is depicted as transparent to show greater detail). Additional angled combs (120, 122) may be positioned to further organize and route the cables to their respective destinations.

Figure 18A:
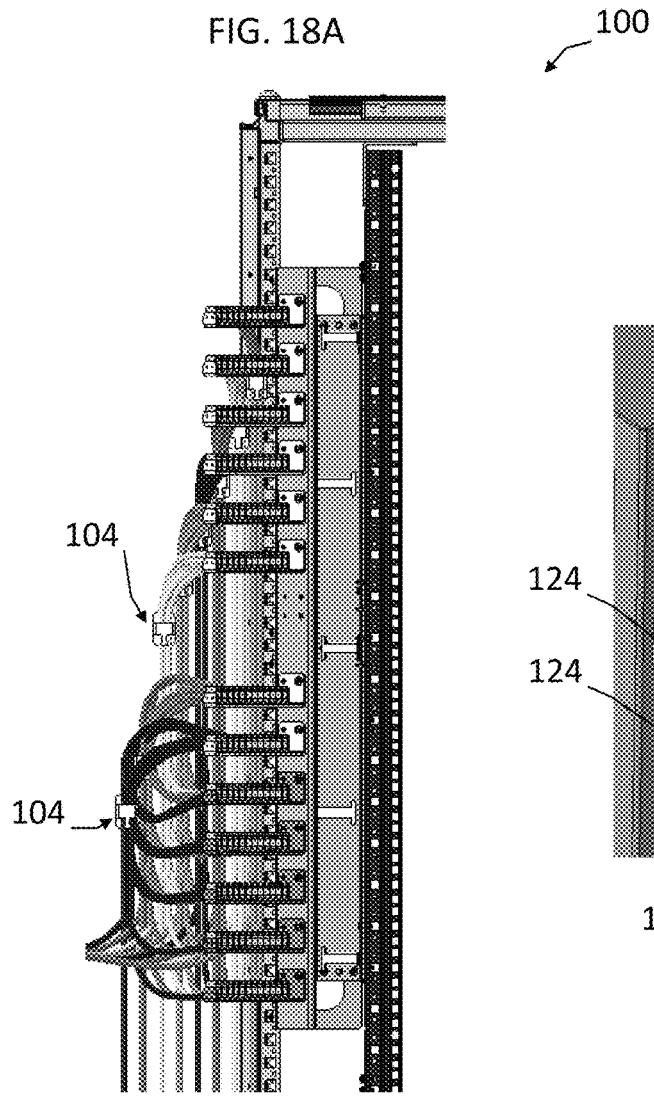
FIG. 18A-18B are diagrams showing a bulk style cable securement system of the present disclosure.
Figure 18B:
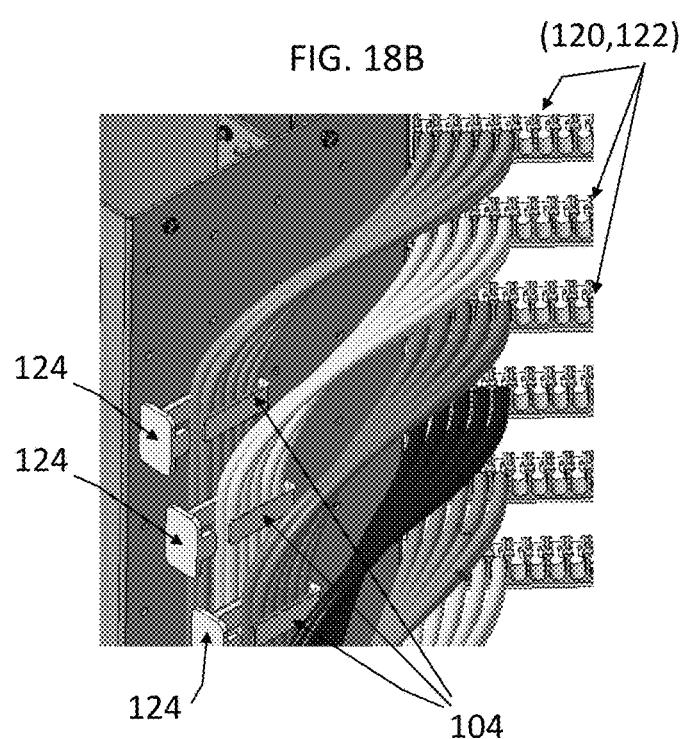

FIG. 18A-18B are diagrams showing a bulk style (hook 104) cable securement system of the present disclosure. FIG. 18A again shows the staircase layout of the cable topology, representing hooks 104 disposed within the cable housing 102 of the rack 100, the hooks 104 acting as the cable securement and routing structures. The walls of the cable housing 102 have been removed to show the cable topology in greater detail. It can be seen that the staircase layout of the hooks 104 allow the cables (108, 112) to be secured and routed in a way as to allow each cable to be easily accessed after instillation, for activities such as maintenance. The cabling topology shown in FIG. 18A shows a top-down cable topology, but is shall be appreciated that the bottom-up cable topology described herein can also be utilized with the hooks 104. The hooks 104 described herein may be any commercially available cable management device of the like.

FIG. 18B shows a closer view of the hooks 104, and how the cables (108, 112) are routed and secured through the hooks 104. The hooks 104 allow each cable (108, 112) to be installed individually, thus allowing access to any cable in the system. The hooks 104 are also adapted to take up any slack in the cables (108, 112), eliminating any cable congestion which may be present when using a single length cable. In various embodiments, the hooks 104 are secured to the structure of the cable housing 102. The present embodiment shows the hooks 104 secured to the rear inner face of the cable housing 102 via the mounting surface 124 of the hooks 104 (the rear inner face of the cable housing 102 is depicted as transparent to show greater detail).

It will be appreciated that the combs 114 shown in FIG. 17 and the hooks 104 shown in FIG. 18 may be used individually, or in combination to adapt to the needs of the rack 100, cables (108, 112), and systems (106A, 106B).

FIG. 19A-19B are diagrams showing a system expansion wherein a first and second rack 100 are disposed adjacent to one another, each containing one or more of a first system 106A and/or an expansion system 106B. FIG. 19A is a top down view of two racks 100 disposed adjacent to one another, the first rack 100A containing a first system 106A and the second rack 100B containing an expansion system 106B. the two systems (106A, 106B) are coupled via a plurality of expansion cables 112, the expansion cables 112 being routed from the first system 106A to the expansion system 106B. The expansion cables 112 are routed and secured by hangers 104 and/or combs 114 to take up any slack in the expansion cables 112.

In various embodiments, all of the expansion cables 112 and the non-expansion cables 108 are the same length. The various hooks 104 and combs 114 take up any slack which may result from this one length cable topology. FIG. 19B shows a front view of the two racks (100A, 100B) containing the non-expansion cables 108 and expansion cables 112. The expansion cables 112 are routed from the first system 106A to the expansion system 106B, and the non-expansion cables 108 are routed locally to the respective system. It will be appreciated that the cabling topology of the present disclosure may include any number of cables (108, 112), hooks 104, combs (114, 120, 122), and systems (106A, 106B).

Figure 20:
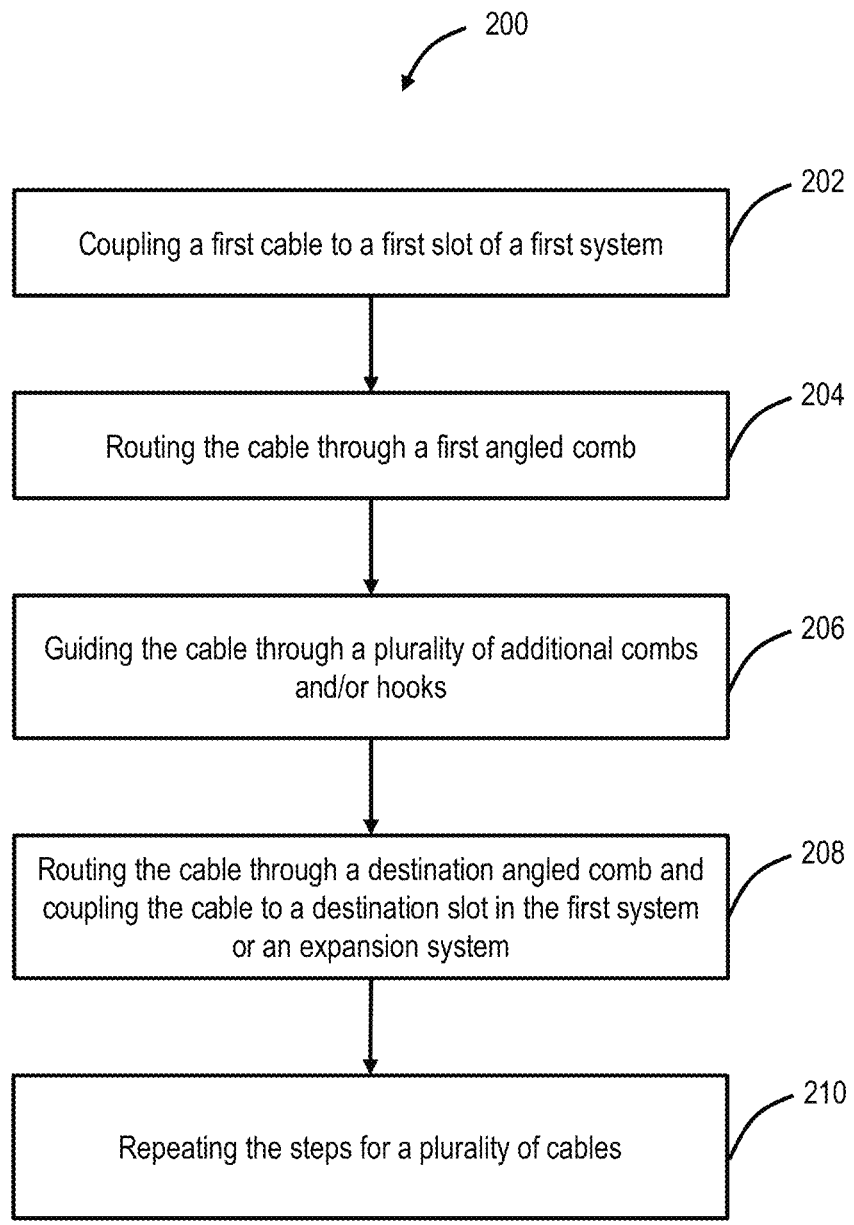
FIG. 20 is a flow diagram of a process for installing cables with the cabling topology of the present disclosure.

FIG. 20 is a flow diagram of the process 200 for installing cables with the cable topology of the present disclosure. A first cable is coupled to a first slot of a first system 202. The cable is routed through a first angled comb 204. The cable is then routed through a plurality of additional combs and/or hooks to take up slack in the cable 206. The cable is then routed through the destination angled comb and coupled to the destination slot in the same system or an expansion system 208. This process is repeated for the remainder of the cables 210.

For a top-down instillation style cable topology, the first slot and first angled comb are the top most slot and top most angled comb, and the process is repeated with the proceeding cables being installed working downward. For a bottom-up instillation style cable topology, the first slot and first angled comb are the bottom most slot and bottom most angled comb, and the process is repeated with the proceeding cables being installed working upward. The cables described in process 200 may be non-expansion cables coupling slots of a single system and/or expansion cables coupling slots of a plurality of systems, the plurality systems either disposed in the same rack or different racks.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A network element comprising:
   a first rack;
   a cable housing disposed on a side of the first rack;
   a plurality of hooks for cable management disposed within the cable housing on the side of the first rack, wherein the plurality of hooks include a plurality of hooks disposed on an inner side and extending towards an outer side within the cable housing of the first rack and a plurality of hooks disposed on the outer side and extending towards the inner side within the cable housing of the first rack; and
   one or more systems disposed in the first rack;
   wherein the one or more systems disposed in the first rack are connected via a plurality of cables each having a same length and any excess slack is managed utilizing any of the plurality of hooks disposed in the cable housing of the first rack.

2. The network element of claim 1, further comprising
   a second rack, wherein the second rack is located adjacent to the first rack;
   a cable housing disposed on a side of the second rack; and
   one or more systems disposed in the second rack;
   wherein one or more systems disposed in the second rack are connected to one another and to the one or more systems disposed in the first rack via a plurality of cables each having a same length and any excess slack is managed utilizing any of the plurality of hooks disposed in the cable housing of one or more of the first rack and the second rack.

3. The network element of claim 1, wherein the plurality of hooks located on the inner side of the cable housing of the first rack are used for local cables and the plurality of hooks located on the outer side of the cable housing of the first rack are used for expansion cables.

4. The network element of claim 1, wherein the plurality of cables include any of Twinaxial cables and fiber cables.

5. The network element of claim 1, wherein the plurality of cables are grouped and color coded for each group.

6. The network element of claim 1, wherein the plurality of hooks include combs to sort and route the plurality of cables.

7. The network element of claim 1, wherein the plurality of hooks are positioned inside of the cable housing of the first rack and secured to the structure of the cable housing of the first rack at the side of the first rack.

8. The network element of claim 1, wherein the plurality of hooks are arranged in a staircase pattern and are adapted to accept cables in a top-down installation style.

9. The network element of claim 1, wherein the plurality of hooks are arranged in a staircase pattern and are adapted to accept cables in a bottom-up installation style.

10. A method for installing cables in a network element comprising the steps of:
    coupling a first cable to a first slot of a system of one or more systems;
    routing the first cable through a first angled comb disposed at an angle between a front and a side of the system;
    guiding the first cable through a plurality of hooks;
    routing the first cable through a destination angled comb disposed at the angle between the front and the side of the system and coupling the cable to a destination slot of one of the system and another system; and
    repeating the steps for a plurality of additional cables;
    wherein the network element comprises
    a first rack;
    a cable housing disposed on a side of the first rack;
    the plurality of hooks for cable management disposed in the cable housing on the side of the first rack, wherein the plurality of hooks include a plurality of hooks disposed on an inner side and extending towards an outer side within the cable housing of the first rack and a plurality of hooks disposed on the outer side and extending towards the inner side within the cable housing of the first rack; and the one or more systems disposed in the first rack;

wherein the one or more systems disposed in the first rack are connected via a plurality of cables each having a same length and any excess slack is managed utilizing any of the plurality of hooks disposed in the cable housing of the first rack.

11. The method of claim 10, wherein the network element further comprises a second rack, wherein the second rack is located adjacent to the first rack;

a cable housing disposed on a side of the second rack; and one or more systems disposed in the second rack;

wherein one or more systems disposed in the second rack are connected to one another and to the one or more systems disposed in the first rack via a plurality of cables each having a same length and any excess slack is managed utilizing any of the plurality of hooks disposed in the cable housing of one or more of the first rack and the second rack.

12. The method of claim 10, wherein the plurality of hooks located on the inner side of the cable housing of the first rack are used for local cables and the plurality of hooks located on the outer side of the cable housing of the first rack are used for expansion cables.

13. The method of claim 10, wherein the plurality of cables include any of Twinaxial cables and fiber cables.

14. The method of claim 10, wherein the plurality of hooks include combs to sort and route the plurality of cables.

15. The method of claim 10, wherein the plurality of hooks are positioned inside of the cable housing of the first rack and secured to the structure of the cable housing of the first rack at the side of the first rack.

16. The method of claim 10, wherein the plurality of hooks are arranged in a staircase pattern and are adapted to accept cables in a top-down installation style.

17. The method of claim 10, wherein the plurality of hooks are arranged in a staircase pattern and are adapted to accept cables in a bottom-up installation style.

* * * * *